US012142509B2

(12) United States Patent
Breiling et al.

(10) Patent No.: US 12,142,509 B2
(45) Date of Patent: Nov. 12, 2024

(54) ELECTROSTATIC CHUCK WITH SEAL SURFACE

(71) Applicant: Lam Research Corporation, Fremont, CA (US)

(72) Inventors: Patrick G. Breiling, Portland, OR (US); Michael Philip Roberts, Tigard, OR (US); Chloe Baldasseroni, Tigard, OR (US); Ishtak Karim, Portland, OR (US); Adrien LaVoie, Newberg, OR (US); Ramesh Chandrasekharan, Portland, OR (US)

(73) Assignee: Lam Research Corporation, Fremont, CA (US)

( * ) Notice: Subject to any disclaimer, the term of this patent is extended or adjusted under 35 U.S.C. 154(b) by 587 days.

(21) Appl. No.: 15/733,687

(22) PCT Filed: Apr. 4, 2019

(86) PCT No.: PCT/US2019/025866
§ 371 (c)(1),
(2) Date: Sep. 29, 2020

(87) PCT Pub. No.: WO2019/195601
PCT Pub. Date: Oct. 10, 2019

(65) Prior Publication Data
US 2021/0013080 A1 Jan. 14, 2021

Related U.S. Application Data

(60) Provisional application No. 62/652,546, filed on Apr. 4, 2018.

(51) Int. Cl.
*H01L 21/683* (2006.01)
*C23C 16/458* (2006.01)
(Continued)

(52) U.S. Cl.
CPC ...... *H01L 21/6833* (2013.01); *C23C 16/4581* (2013.01); *H01J 37/32082* (2013.01);
(Continued)

(58) Field of Classification Search
CPC ............. H01L 21/6833; H01L 21/6831; H01L 21/68735; H01L 21/6875; H01L 21/67276;
(Continued)

(56) References Cited

U.S. PATENT DOCUMENTS 5,530,616 A * 6/1996 Kitabayashi ........... H02N 13/00
361/234
5,699,223 A * 12/1997 Mashiro ............... H01L 21/6833
361/234

(Continued)

FOREIGN PATENT DOCUMENTS

CN 102282645 A 12/2011
JP H0718438 A 1/1995
(Continued)

OTHER PUBLICATIONS

International Preliminary Report on Patentability dated Oct. 15, 2020 in PCT/US2019/025866.
(Continued)

*Primary Examiner* — Ram N Kackar
*Assistant Examiner* — Laureen Chan
(74) *Attorney, Agent, or Firm* — Weaver Austin Villeneuve & Sampson LLP

(57) ABSTRACT

Apparatuses and systems for pedestals are provided. An example pedestal may have a body with an upper annular seal surface that is planar, perpendicular to a vertical center axis of the body, and has a radial thickness, a lower recess surface offset from the upper annular seal surface, and a plurality of micro-contact areas (MCAs) protruding from the
(Continued)

lower recess surface, each MCA having a top surface offset from the lower recess surface by a second distance less, and one or more electrodes within the body. The upper annular seal surface may be configured to support an outer edge of a semiconductor substrate when the semiconductor substrate is being supported by the pedestal, and the upper annular seal surface and the tops of the MCAs may be configured to support the semiconductor substrate when the semiconductor substrate is being supported by the pedestal.

33 Claims, 12 Drawing Sheets

(51) Int. Cl.
H01J 37/32 (2006.01)
H01L 21/687 (2006.01)
(52) U.S. Cl.
CPC .. *H01J 37/32091* (2013.01); *H01J 37/32715* (2013.01); *H01L 21/6831* (2013.01); *H01L 21/68735* (2013.01); *H01L 21/6875* (2013.01); *H01J 2237/2005* (2013.01)
(58) Field of Classification Search
CPC ............ H01L 21/6835; H01L 21/683; C23C 16/4581; C23C 16/466; C23C 16/458; H01J 37/32082; H01J 2237/2005; H01J 37/32091; H01J 37/32899; H01J 37/32715; H01J 37/32724; B23Q 3/15; H02N 13/00
See application file for complete search history.

(56) References Cited

U.S. PATENT DOCUMENTS

| | | | | |
|---|---|---|---|---|
| 5,761,023 | A * | 6/1998 | Lue | G03F 7/70708 361/233 |
| 5,886,866 | A * | 3/1999 | Hausmann | H01L 21/6833 279/128 |
| 6,185,085 | B1 * | 2/2001 | Hwang | H01L 21/68707 361/234 |
| 9,428,833 | B1 | 8/2016 | Duvall et al. | |
| 10,622,243 | B2 | 4/2020 | Breiling et al. | |
| 2002/0170882 | A1 * | 11/2002 | Akiba | H01L 21/6833 118/724 |
| 2004/0040665 | A1 * | 3/2004 | Mizuno | H02N 13/00 118/728 |
| 2005/0163598 | A1 * | 7/2005 | Yuasa | H01L 21/68707 414/217 |
| 2006/0090855 | A1 * | 5/2006 | Kimura | H01L 21/67109 118/724 |
| 2007/0040265 | A1 * | 2/2007 | Umotoy | C23C 16/45521 257/704 |
| 2009/0059462 | A1 | 3/2009 | Mizuno et al. | |
| 2009/0122458 | A1 * | 5/2009 | Lischer | H01L 21/6831 361/234 |
| 2009/0284894 | A1 * | 11/2009 | Cooke | H01L 21/6833 438/700 |
| 2010/0265631 | A1 * | 10/2010 | Stone | H01L 21/6831 29/559 |
| 2011/0111601 | A1 * | 5/2011 | Okita | H01L 21/67069 156/345.24 |
| 2012/0164834 | A1 * | 6/2012 | Jennings | H01L 21/67201 118/723 R |
| 2015/0132967 | A1 * | 5/2015 | Urakawa | H01L 21/67109 156/345.24 |
| 2016/0181137 | A1 | 6/2016 | Lee et al. | |
| 2016/0225651 | A1 | 8/2016 | Tran et al. | |
| 2016/0358808 | A1 * | 12/2016 | Madsen | C23C 16/50 |
| 2017/0140968 | A1 | 5/2017 | Sakiyama et al. | |
| 2018/0033672 | A1 * | 2/2018 | Woytowitz | C23C 16/4581 |
| 2018/0076100 | A1 | 3/2018 | Sakiyama et al. | |
| 2018/0122685 | A1 | 5/2018 | Breiling et al. | |
| 2020/0227304 | A1 | 7/2020 | Breiling et al. | |

FOREIGN PATENT DOCUMENTS

| | | |
|---|---|---|
| JP | H1041378 A | 2/1998 |
| JP | 2000106392 A | 4/2000 |
| JP | 2002270680 A | 9/2002 |
| JP | 2003258057 A | 9/2003 |
| JP | 2005109169 A | 4/2005 |
| JP | 2012216774 A | 11/2012 |
| JP | 2014099519 A | 5/2014 |
| JP | 2014116433 A | 6/2014 |
| JP | 2017212374 A | 11/2017 |
| KR | 20140063415 A | 5/2014 |
| KR | 20170066215 A | 6/2017 |
| WO | WO-2009144938 A1 | 12/2009 |

OTHER PUBLICATIONS

International Search report and Written Opinion dated Jul. 22, 2019, issued in PCT/US2019/025866.
JP Office Action dated Mar. 22, 2023, in Application No. 2020-554099 with English translation.
KR Office Action dated Feb. 9, 2024 in KR Application No. 10-2020-7031813, with English Translation.
CN Office Action dated Jun. 27, 2024 in CN Application No. 201980024665.7, with English Translation.
Reasons for Revocation dated Jun. 19, 2024 in Opposition No. 2024-700308 re JP Patent No. 7356446.

* cited by examiner

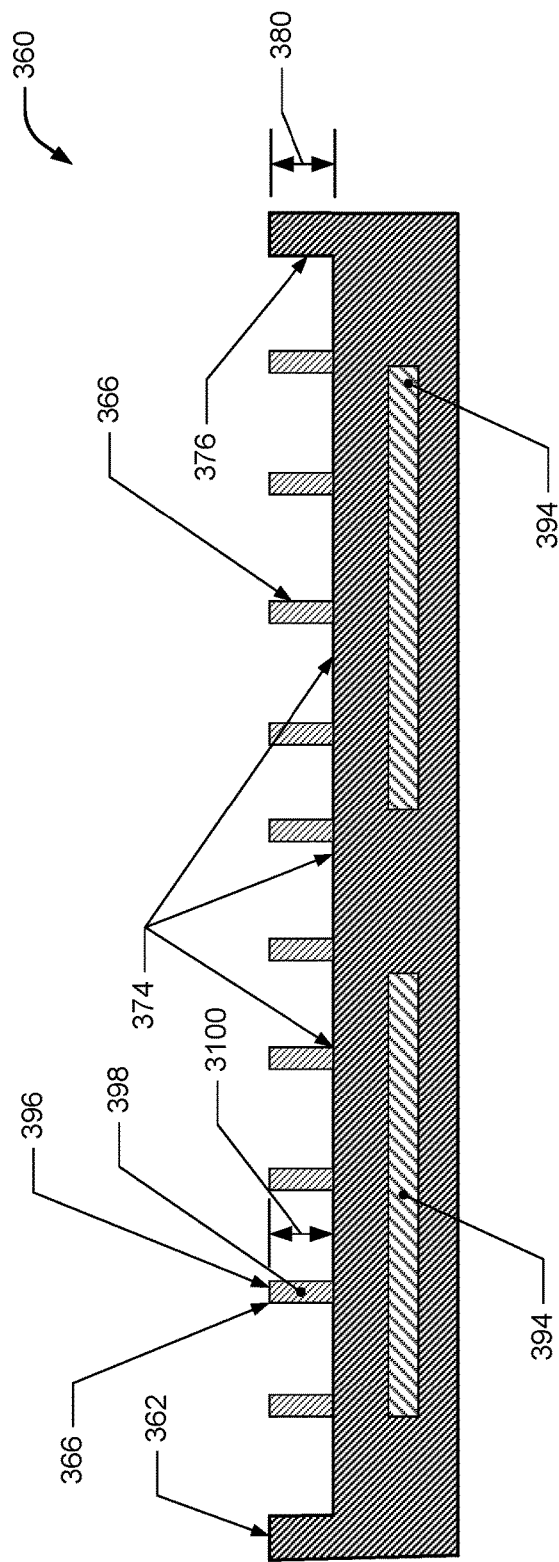
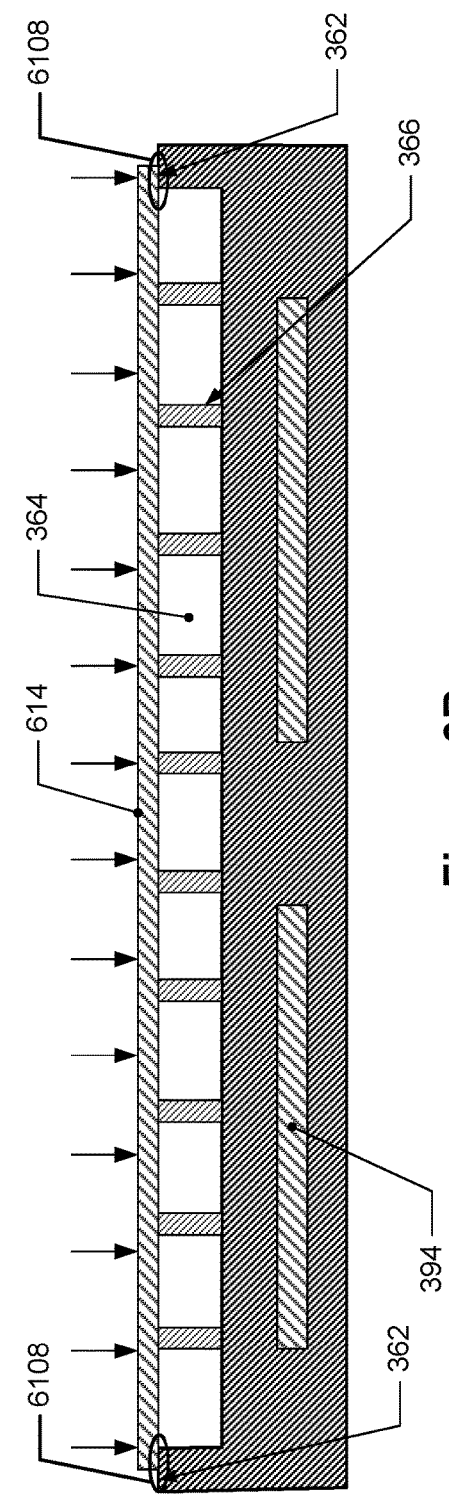
Figure 6A
Figure 6B

ELECTROSTATIC CHUCK WITH SEAL SURFACE

INCORPORATION BY REFERENCE

A PCT Request Form is filed concurrently with this specification as part of the present application. Each application that the present application claims benefit of or priority to as identified in the concurrently filed PCT Request Form is incorporated by reference herein in its entirety and for all purposes.

BACKGROUND

During semiconductor processing operations, a substrate is typically supported on a pedestal within a processing chamber.

SUMMARY

The systems, methods and devices of this disclosure each have several innovative aspects, no single one of which is solely responsible for the desirable attributes disclosed herein. Included among these aspects are at least the following implementations, although further implementations may be set forth in the detailed description or may be evident from the discussion provided herein.

In some embodiments, a pedestal may be provided. The pedestal may include a body that includes an upper annular seal surface that is planar, is perpendicular to a vertical center axis of the body, and has a radial thickness, a lower recess surface that is offset from the upper annular seal surface by a first distance, a plurality of micro-contact areas (MCAs) protruding from the lower recess surface, each MCA having a top surface that is offset from the lower recess surface by a second distance less than or equal to the first distance, and one or more electrodes within the body. The upper annular seal surface may be configured to support an outer edge of a semiconductor substrate when the semiconductor substrate is being supported by the pedestal, the upper annular seal surface and the top surfaces of the MCAs may be configured to support the semiconductor substrate when the semiconductor substrate is being supported by the pedestal, and the one or more electrodes may be configured to electrically connect with a radio frequency (RF) power supply, an electrical ground, or a direct current (DC) power supply.

In some embodiments, the one or more electrodes may be electrostatic clamp electrodes, and the one or more electrostatic clamp electrodes may be configured to provide an electrostatic clamping force on the semiconductor substrate when the semiconductor substrate is being supported by the pedestal and when the one or more electrostatic clamp electrodes are powered by the DC power supply.

In some such embodiments, a seal may be created between the upper annular seal surface and the semiconductor substrate when the semiconductor substrate is being supported by the pedestal and when the one or more electrostatic clamp electrodes provide the electrostatic clamping force on the semiconductor substrate.

In some embodiments, the one or more electrodes may be configured to electrically connect with the RF power supply, or receive RF power from the RF power supply.

In some embodiments, the upper annular seal surface may have an inner radius less than the radius of the semiconductor substrate, and an outer radius greater than the radius of the semiconductor substrate.

In some such embodiments, the inner radius may be about 142 millimeters.

In some further such embodiments, the outer radius may be about 150 millimeters.

In some embodiments, the radial thickness may be less than or equal to about 25 millimeters.

In some such embodiments, the radial thickness may be less than or equal to about 15 millimeters.

In some embodiments, the upper annular seal surface and the top surfaces of the MCAs may be coplanar, and the first distance may be equal to the second distance.

In some such embodiments, the first distance and the second distance may be equal to or between 0.0127 millimeters and 0.0381 millimeters.

In some further such embodiments, the first distance and the second distance may be 0.0254 millimeters.

In some embodiments, the first distance may be greater than the second distance.

In some such embodiments, the first distance and the second distance may be equal to or between 0.0127 millimeters and 0.0381 millimeters.

In some embodiments, the plurality of MCAs may include more than 2,000 MCAs.

In some such embodiments, the plurality of MCAs may include more than 4,000 MCAs.

In some such embodiments, substantially all the MCAs may be spaced equally from each other.

In some further such embodiments, substantially all MCAs may be spaced from each other by 3.9 millimeters.

In some such embodiments, the plurality of MCAs may be divided into a plurality of sub-arrangements, and the MCAS in each sub-arrangement may be positioned on the lower recess surface in a triangular pattern, a square pattern, a symmetrical pattern, a radial arrangement, or a hexagonal pattern.

In some embodiments, the lower recess surface may have a recess surface area, each MCA top surface may have a top surface area, and a total of all the top surface areas of the MCAs in the plurality of MCAs may be less than or equal to 3% of the recess surface area.

In some embodiments, each MCA may be a cylinder that has a planar top surface area.

In some such embodiments, the radius of each MCA may be about 0.35 millimeters.

In some embodiments, the upper annular seal surface may have a roughness between about 0.8128 microns and about 0.2032 microns.

In some embodiments, each MCA top surface may have a roughness between about 0.8128 microns and about 0.2032 microns.

In some embodiments, the upper annular seal surface may have a flatness having a maximum range of 0.0254 millimeters.

In some embodiments, each MCA top surface may have a flatness having a maximum range of 0.0254 millimeters.

In some embodiments, the body may include a ceramic.

In some embodiments, the body may include a metal or metal alloy, and the body may be coated with a ceramic.

In some embodiments, a semiconductor processing system may be included. The system may include a processing chamber, one or more processing stations in the processing chamber, an electrostatic chuck in each of the one or more processing stations. Each electrostatic chuck may have a body that includes an upper annular seal surface that is planar, is perpendicular to a vertical center axis of the body, and has a radial thickness, a lower recess surface that is offset from the upper annular seal surface by a first distance, a plurality of micro-contact areas (MCAs) protruding from the lower recess surface, each MCA having a top surface that is offset from the lower recess surface by a second distance less than or equal to the first distance, and one or more electrostatic clamp electrodes within the body. The upper annular seal surface may be configured to support an outer edge of a semiconductor substrate when the semiconductor substrate is being supported by the electrostatic chuck, the upper annular seal surface and the top surfaces of the MCAs may be configured to support the semiconductor substrate when the semiconductor substrate is being supported by the electrostatic chuck, and the one or more electrostatic clamp electrodes may be configured to provide an electrostatic clamping force on the semiconductor substrate when the semiconductor substrate is being supported by the electrostatic chuck and when the one or more electrostatic clamp electrodes are powered by a DC power supply. The system may also include the DC power source electrically connected to the electrostatic clamp electrodes and a controller having a memory and a processor, the memory storing instructions configured to cause the DC power source to provide power to the electrostatic clamp electrodes in order to provide the electrostatic clamping force on the semiconductor substrate when the semiconductor substrate is being supported by the electrostatic chuck.

In some embodiments, the system may further include an end effector configured to position the semiconductor substrate on each of the electrostatic chucks. The memory may further stores instructions configured to cause the end effector to position the semiconductor substrate on each of the electrostatic chucks, and cause, after positioning the semiconductor substrate on one of the electrostatic chucks, the DC power source to provide power to the electrostatic clamp electrodes in that one electrostatic chuck in order to provide the electrostatic clamping force on that semiconductor substrate.

In some embodiments, the memory may further stores instructions configured to cause, while the end effector is positioning the semiconductor substrate on one of the electrostatic chucks, the DC power source to provide power to the electrostatic clamp electrodes of that one electrostatic chuck in order to provide a lower electrostatic clamping force on that semiconductor substrate.

In some embodiments, a semiconductor processing system may be included. The system may include a processing chamber, one or more processing stations in the processing chamber, and a pedestal in each of the one or more processing stations. Each pedestal may have a body that includes an upper annular seal surface that is planar, is perpendicular to a vertical center axis of the body, and has a radial thickness, a lower recess surface that is offset from the upper annular seal surface by a first distance, a plurality of micro-contact areas (MCAs) protruding from the lower recess surface, each MCA having a top surface that is offset from the lower recess surface by a second distance less than or equal to the first distance, and one or more electrodes within the body. The upper annular seal surface may be configured to support an outer edge of a semiconductor substrate when the semiconductor substrate is being supported by the pedestal, the upper annular seal surface and the top surfaces of the MCAs may be configured to support the semiconductor substrate when the semiconductor substrate is being supported by the pedestal, and the one or more electrodes may be configured to electrically connect with a radio frequency (RF) power supply. The system may also include a showerhead above the pedestal electrically connected to an electrical ground, the RF power supply electrically connected to the one or more electrodes, and a controller having a memory and a processor, the memory storing instructions configured to cause the RF power source to provide an RF voltage to the one or more electrodes in order to generate a plasma between the pedestal and the showerhead.

In some embodiments, an electrostatic clamping force may not be applied to the substrate while the plasma is generated between the pedestal and the showerhead.

In some embodiments, the system may further include a direct current (DC) power source. The DC power source may be electrically connected to the one or more electrodes, the one or more electrodes may be configured to provide an electrostatic clamping force on the semiconductor substrate when the semiconductor substrate is being supported by the pedestal and when the one or more electrodes are powered by the DC power source, and the memory may further stores instructions configured to cause the DC power source to provide power to the one or more electrodes in order to provide the electrostatic clamping force on the semiconductor substrate when the semiconductor substrate is being supported by the pedestal.

BRIEF DESCRIPTION OF THE DRAWINGS

FIG. 6A depicts the illustrative cross-sectional slice of the ESC body of FIG. 4A along with MCA features.

FIG. 6B depicts a substrate positioned on the representational ESC of FIG. 6A.

DETAILED DESCRIPTION

Figure 1:
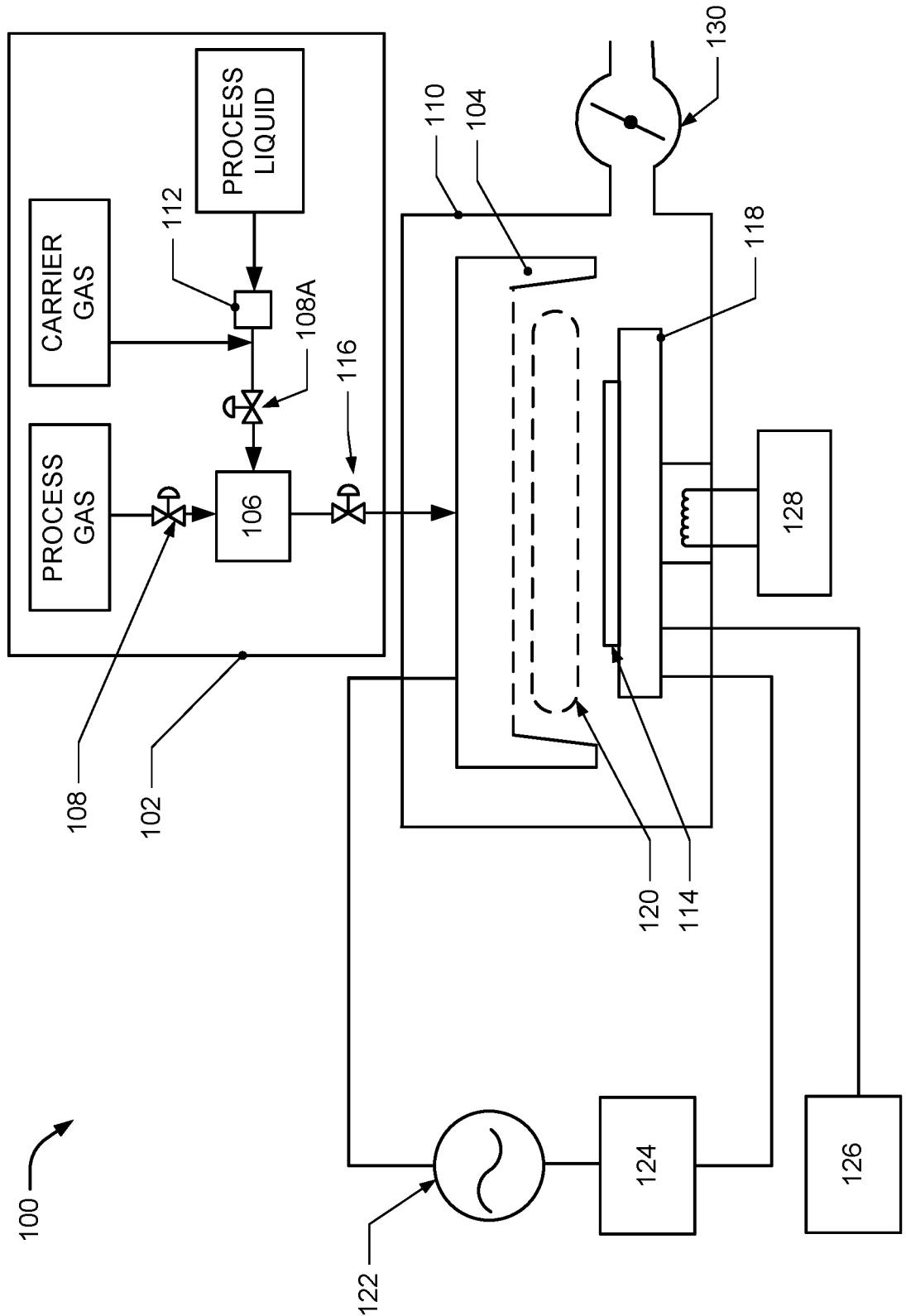
FIG. 1 depicts a substrate processing apparatus for depositing films on semiconductor substrates using any number of processes.

In the following description, numerous specific details are set forth in order to provide a thorough understanding of the presented concepts. The presented concepts may be practiced without some or all of these specific details. In other instances, well known process operations have not been described in detail so as to not unnecessarily obscure the described concepts. While some concepts will be described in conjunction with the specific embodiments, it will be understood that these embodiments are not intended to be limiting.

In some types of semiconductor processing, a wafer or substrate is processed within a processing chamber that may have a pedestal or support structure on which the wafer may be placed during this processing. In this application, the terms "semiconductor wafer," "wafer," "substrate," "wafer substrate," and "partially fabricated integrated circuit" are used interchangeably. One of ordinary skill in the art would understand that the term "partially fabricated integrated circuit" can refer to a silicon wafer during any of many stages of integrated circuit fabrication thereon. A wafer or substrate used in the semiconductor device industry typically has a diameter of 200 mm, or 300 mm, or 450 mm. The following detailed description assumes the invention is implemented for use with such a wafer. However, the invention is not so limited. The work piece may be of various shapes, sizes, and materials. In addition to semiconductor wafers, other work pieces that may take advantage of this invention include various articles such as printed circuit boards, magnetic recording media, magnetic recording sensors, mirrors, optical elements, micro-mechanical devices and the like.

Semiconductor processing may include the deposition of one or more layers of film onto a substrate, such as chemical vapor deposition ("CVD"), plasma-enhanced CVD ("PECVD"), atomic layer deposition ("ALD"), low pressure CVD, ultra-high CVD, physical vapor deposition ("PVD"), and conformal film deposition ("CFD"). For instance, some CVD processes may deposit a film on a wafer surface by flowing one or more gas reactants into a reactor which form film precursors and by-products. The precursors are transported to the wafer surface where they are adsorbed by the wafer, diffused into the wafer, and deposited on the wafer by chemical reactions which also generate by-products that are removed from the surface and from the reactor. For another example, some deposition processes involve multiple film deposition cycles, each producing a "discrete" film thickness. ALD is one such film deposition method, but any technique which puts down thin layers of film and used in a repeating sequential matter may be viewed as involving multiple cycles of deposition.

As device and features size continue to shrink in the semiconductor industry, and also as 3D devices structures become more prevalent in integrated circuit (IC) design, the capability of depositing thin conformal films (films of material having a uniform thickness relative to the shape of the underlying structure, even if non-planar) continues to gain importance. ALD is a film forming technique which is well-suited to the deposition of conformal films due to the fact that a single cycle of ALD only deposits a single thin layer of material, the thickness being limited by the amount of one or more film precursor reactants which may adsorb onto the substrate surface (i.e., forming an adsorption-limited layer) prior to the film-forming chemical reaction itself. Multiple "ALD cycles" may then be used to build up a film of the desired thickness, and since each layer is thin and conformal, the resulting film substantially conforms to the shape of the underlying devices structure. In certain embodiments, each ALD cycle includes the following steps:
1. Exposure of the substrate surface to a first precursor.
2. Purge of the reaction chamber in which the substrate is located.
3. Activation of a reaction of the substrate surface, typically with a plasma and/or a second precursor.
4. Purge of the reaction chamber in which the substrate is located.

FIG. 1 shows a substrate processing apparatus for depositing films on semiconductor substrates using any number of processes. The apparatus 100 of FIG. 1 has a single processing chamber 110 with a single substrate holder 118 (e.g., a pedestal or ESC) in an interior volume which may be maintained under vacuum by vacuum pump 130. Also fluidically coupled to the chamber for the delivery of (for example) film precursors, carrier and/or purge and/or process gases, secondary reactants, etc. is gas delivery system 102 and showerhead 104. Equipment for generating a plasma within the processing chamber is also shown in FIG. 1. The apparatus schematically illustrated in FIG. 1 is commonly for performing ALD, although it may be adapted for performing other film deposition operations such as conventional CVD, particularly plasma enhanced CVD.

Figure 2:
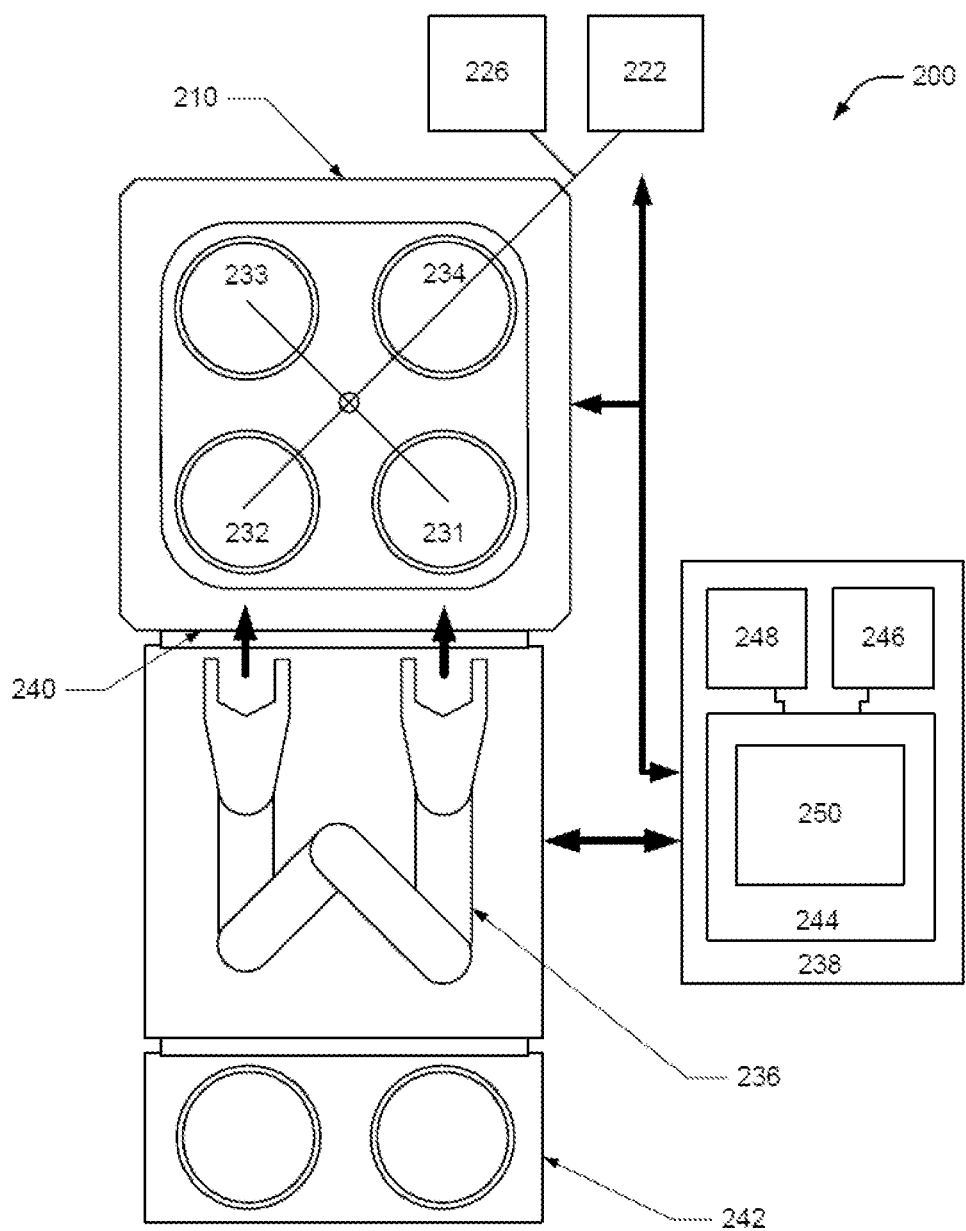
FIG. 2 depicts an implementation of a multi-station processing tool.

For simplicity, processing apparatus 100 is depicted as a standalone process station having a process chamber body 110 for maintaining a low-pressure environment. However, it will be appreciated that a plurality of process stations may be included in a common process tool environment—e.g., within a common reaction chamber—as described herein. For example, FIG. 2 depicts an implementation of a multi-station processing tool and is discussed in further detail below. Further, it will be appreciated that, in some implementations, one or more hardware parameters of processing apparatus 100, including those discussed in detail herein, may be adjusted programmatically by one or more system controllers.

Process station 100 fluidically communicates with gas delivery system 102 for delivering process gases, which may include liquids and/or gases, to a distribution showerhead 104. Gas delivery system 102 includes a mixing vessel 106 for blending and/or conditioning process gases for delivery to showerhead 104. One or more mixing vessel inlet valves 108 and 108A may control introduction of process gases to mixing vessel 106.

Some reactants may be stored in liquid form prior to vaporization and subsequent to delivery to the process chamber 110. The implementation of FIG. 1 includes a vaporization point 112 for vaporizing liquid reactant to be supplied to mixing vessel 106. In some implementations, vaporization point 112 may be a heated liquid injection module. In some other implementations, vaporization point 112 may be a heated vaporizer. In yet other implementations, vaporization point 112 may be eliminated from the process station. In some implementations, a liquid flow controller (LFC) upstream of vaporization point 112 may be provided for controlling a mass flow of liquid for vaporization and delivery to processing chamber 110.

Showerhead 104 distributes process gases and/or reactants (e.g., film precursors) toward substrate 114 at the process station, the flow of which is controlled by one or more valves upstream from the showerhead (e.g., valves 108, 108A, and 116). In the implementation shown in FIG. 1, substrate 114 is located beneath showerhead 104, and is shown resting on an ESC 118. Showerhead 104 may have any suitable shape, and may have any suitable number and arrangement of ports for distributing processes gases to substrate 114. In some implementations with two or more stations, the gas delivery system 102 includes valves or other flow control structures upstream from the showerhead, which can independently control the flow of process gases and/or reactants to each station such that gas may be flowed to one station but not another. Furthermore, the gas delivery system 102 may be configured to independently control the process gases and/or reactants delivered to each station in a multi-station apparatus such that the gas composition provided to different stations is different; e.g., the partial pressure of a gas component may vary between stations at the same time.

A volume 120 is located beneath showerhead 104. In some implementations, ESC 118 may be raised or lowered to expose substrate 114 to volume 120 and/or to vary a volume of volume 120. Optionally, ESC 118 may be lowered and/or raised during portions of the deposition process to modulate process pressure, reactant concentration, etc. within volume 120.

In FIG. 1, showerhead 104 and ESC 118 are electrically connected to RF power supply 122 and matching network 124 for powering a plasma. In some implementations, the plasma energy may be controlled (e.g., via a system controller having appropriate machine-readable instructions and/or control logic) by controlling one or more of a process station pressure, a gas concentration, an RF source power, an RF source frequency, and a plasma power pulse timing. For example, RF power supply 122 and matching network 124 may be operated at any suitable power to form a plasma having a desired composition of radical species. Likewise, RF power supply 122 may provide RF power of any suitable frequency and power. The apparatus 100 also includes a DC power supply 126 that is configured to provide a direct current to the ESC 118 in order to generate and provide an electrostatic clamping force to the ESC 118 and the substrate 114. The ESC 118 may also have one or more temperature control elements 128 that are configured to heat and/or cool the substrate 114.

In some implementations, the apparatus is controlled with appropriate hardware and/or appropriate machine-readable instructions in a system controller which may provide control instructions via a sequence of input/output control (IOC) instructions. In one example, the instructions for setting plasma conditions for plasma ignition or maintenance are provided in the form of a plasma activation recipe of a process recipe. In some cases, process recipes may be sequentially arranged, so that all instructions for a process are executed concurrently with that process. In some implementations, instructions for setting one or more plasma parameters may be included in a recipe preceding a plasma process. For example, a first recipe may include instructions for setting a flow rate of an inert (e.g., helium) and/or a reactant gas, instructions for setting a plasma generator to a power set point, and time delay instructions for the first recipe. A second, subsequent recipe may include instructions for enabling the plasma generator and time delay instructions for the second recipe. A third recipe may include instructions for disabling the plasma generator and time delay instructions for the third recipe. It will be appreciated that these recipes may be further subdivided and/or iterated in any suitable way within the scope of the present disclosure.

As described above, one or more process stations may be included in a multi-station substrate processing tool. FIG. 2 shows an example multi-station substrate processing apparatus. Various efficiencies may be achieved through the use of a multi-station processing apparatus like that shown in FIG. 2 with respect to equipment cost, operational expenses, as well as increased throughput. For instance, a single vacuum pump may be used to create a single high-vacuum environment for all four process stations by evacuating spent process gases, etc. for all four process stations. Depending on the implementation, each process station may have its own dedicated showerhead for gas delivery, but may share the same gas delivery system. Likewise, certain elements of the plasma generator equipment may be shared amongst process stations (e.g., power supplies), although depending on the implementation, certain aspects may be process station-specific (for example, if showerheads are used to apply plasma-generating electrical potentials). Once again, it is to be understood that such efficiencies may also be achieved to a greater or lesser extent by using more or fewer numbers of process stations per processing chamber such as 2, 3, 5, 6, 7, 8, 9, 10, 11, 12, 13, 14, 15, or 16, or more process stations per reaction chamber.

The substrate processing apparatus 200 of FIG. 2 employs a single substrate processing chamber 210 that contains multiple substrate process stations, each of which may be used to perform processing operations on a substrate held in a wafer holder, e.g., a pedestal or an ESC, at that process station. In this particular implementation, the multi-station substrate processing apparatus 200 is shown having four process stations 231, 232, 233, and 234. Other similar multi-station processing apparatuses may have more or fewer processing stations depending on the implementation and, for instance, the desired level of parallel wafer processing, size/space constraints, cost constraints, etc. Also shown in FIG. 2 are a substrate handler robot 236 and a controller 238.

As shown in FIG. 2, the multi-station processing tool 200 has a substrate loading port 240, and a robot 236 configured to move substrates from a cassette loaded through a pod 242 through atmospheric port 240, into the processing chamber 210, and onto one of the four stations 231, 232, 233, or 234.

The depicted processing chamber 210 shown in FIG. 2 provides four process stations, 231, 232, 233, or 234. The RF power is generated at an RF power system 222 and distributed to each of the stations 231, 232, 233, or 234; similarly a DC power source 226 is distributed to each of the station. The RF power system may include one or more RF power sources, e.g., a high frequency (HFRF) and a low frequency (LFRF) source, impedance matching modules, and filters. In certain implementations, the power source may be limited to only the high frequency or low frequency source. The distribution system of the RF power system may be symmetric about the reactor and may have high impedance. This symmetry and impedance result in approximately equal amounts of power being delivered to each station.

FIG. 2 also depicts an implementation of a system controller 238 employed to control process conditions and hardware states of process tool 200 and its process stations. System controller 238 may include one or more memory devices 244, one or more mass storage devices 246, and one or more processors 248. Processor 248 may include one or more CPUs, ASICs, general-purpose computer(s) and/or specific purpose computer(s), one or more analog and/or digital input/output connection(s), one or more stepper motor controller board(s), etc.

The system controller 238 may execute machine-readable system control instructions 250 on processor 248 the system control instructions 250, in some implementations, loaded into memory device 244 from mass storage device 246. System control instructions 250 may include instructions for controlling the timing, mixture of gaseous and liquid reactants, chamber and/or station pressure, chamber and/or station temperature, wafer temperature, target power levels, RF power levels, RF exposure time, DC power and duration to clamp a substrate, substrate pedestal, chuck, and/or susceptor position, plasma formation in each station (which, as discussed above, may include independent plasma formation in one or more stations), flow of gaseous and liquid reactants (which, as stated above, may include independent flow to one or more stations) and other parameters of a particular process performed by process tool 200. These processes may include various types of processes including, but not limited to, processes related to deposition of film on substrates. System control instructions 258 may be configured in any suitable way.

During various aspects of processing it may be desirable to keep the wafer in a fixed position because substrate movement during the processing may adversely affect the processing of the substrate, such as the deposited layers, and may adversely affect the ability of the semiconductor processing tool to index and move the substrate.

A wafer may be secured in place within a semiconductor processing chamber by an electrostatic chuck (ESC). Some ESCs hold a wafer, which may be electrostatically charged as a result of processing operations, in place by applying a single direct current ("DC") voltage to one or more clamping electrodes within the ESC such that the clamping electrode(s) and the wafer act as a capacitive circuit; the capacitive circuit may be completed by the existence of a plasma within the chamber. The clamping electrode(s) are typically thin, planar structures that are parallel to the overall plane of the wafer, and often extend across a region commensurate with the wafer size. The electrostatic force that arises due to the capacitive effect provides the clamping force. Such a configuration may be called "monopolar."

ESCs may also be used in chambers that do not produce plasma environments during processing. In such implementations, the plasma cannot be relied upon to complete the capacitive circuit and the ESC electrodes may instead include one or more cathodes and one or more anodes. The anodes and cathodes may occupy different regions of the ESC that face towards the wafer, e.g., an anode and cathode that occupy opposing semicircular regions under the wafer or an anode or a cathode arranged as a center circular electrode and a concentric outer electrode under the wafer acting as an anode. The anode and the cathode in such ESCs are electrically isolated from one another within the ESC, but when a wafer is placed on the ESC, the wafer completes two capacitive circuits—one where the wafer is the anode to the ESC cathode, and one where the wafer is the cathode to the ESC anode.

ESCs may have a dielectric layer or other insulator interposed between the clamping electrode(s) and the wafer; this dielectric or insulating layer serves to prevent a short circuit between the clamping electrode(s) and the other half of the capacitive circuit(s), i.e., the wafer, and defines the gap that governs the capacitance characteristics of the capacitive circuit formed by the ESC and the wafer. It is common to embed the electrodes within the dielectric or insulating material to protect the electrodes from exposure to the processing environment.

Some ESCs may also include lift pin holes that allow lift pins to extend through the ESC and lift the wafer off of the ESC. The ESC lift pins may be configured to fully retract into the ESC lift pin holes such that in one position, the ESC lift pins do not extend past the ESC. These lift pins and their corresponding holes, among other things, allow a robot end effector or other mechanical device to place and/or remove a wafer from the ESC without contacting and/or interfering with the ESC.

Many current ESCs and wafer support pedestals (e.g., pedestals without a clamping force) allow for unintended deposition on the backside of a wafer which is undesired for numerous reasons. For example, during deposition in a processing chamber, film can be deposited not only on a front side of a wafer, but also on a backside of the wafer. In conformal deposition techniques, such as atomic layer deposition (ALD) for instance, a film can be deposited layer by layer by successive dosing and activation steps. In many ALD processing chambers, precursor gases can be directed to a wafer and the precursor gases can chemisorb onto a surface of the wafer to form a monolayer. Additional precursor gases can be introduced that react with the monolayer, and a purge gas can be subsequently introduced to remove excess precursors and gaseous reaction by-products. Precursor gases can be alternately pulsed without overlap, and cycles can be repeated as many times as desired to form a film of suitable thickness.

However, during the deposition process, process gases, such as precursor gases in ALD, can be deposited on surfaces of the wafer on which no deposition is desired, e.g., on the backside of the wafer. Since ALD is a surface-based deposition process, film can be deposited on any accessible surface in the processing chamber. Thus, any gap accessing the backside of the wafer can permit process gases to flow to the backside. Film on the backside can be generated by transport of precursor gases during the dose step, and the reaction of the precursor gases can occur during the activation step. In some implementations, a ring of undesired film as thick as the front side film at the outer edge of the wafer can develop on the backside of the wafer and extend to greater than 5 mm inward from the outer edge of the wafer.

One of the drawbacks of such undesired backside deposition is that it can lead to alignment/focusing issues during lithography. To apply a desired pattern onto a target portion of the wafer, various tools in lithography can be used for proper alignment and focusing for the desired pattern. After a deposition step, if film is deposited on the backside of the wafer, then the various lithography tools may require re-adjustment in focus and alignment. This can lead to unwanted lithography traces during patterning which can lead to wafer defects, and increased time spent re-calibrating the various lithography tools.

ESCs described herein are configured to exert electrostatic clamping forces on a substrate to cause the backside of the substrate to be forced downward against an upper annular seal surface of the ESC in order to prevent or reduce the flow of gases to the underside of the substrate, thereby reducing or practically eliminating deposition on the backside of the substrate. As stated above, the nature of conformal deposition causes deposition to occur wherever the processes gases may flow, including any surface of the substrate that is exposed to these gases. In order to prevent the process gases and other material from flowing to the underside of the substrate, a seal between the underside of the substrate and the planar, smooth upper annular seal surface may be created in an area beginning at the edge of the underside of the substrate and extending radially inwards towards a vertical center axis of the body of the ESC. With the seal occurring at the edge of the substrate, gases and other material are not able to flow under the substrate. The application of a downward electrostatic clamping force may assist in causing the edge of the underside of the substrate, and a portion of the underside of the substrate, to contact and create the seal with the upper annular seal surface.

The use of the upper annular seal surface, as opposed to a continuous planar circular seal surface that has a diameter equal to or larger than the substrate, results in many advantages. For example, when a substrate is positioned on a planar, circular surface of an ESC, air (or other gas) may be caught between this circular surface and the substrate when the substrate is placed onto the ESC which may cause the substrate to translate and/or rotate relative to the ESC before the trapped gas can escape, i.e., to "float" on the cushion of trapped gas, which can lead to indexing errors and wafer defects caused by wafer misalignment. Additionally, unintended deposition of material may occur on interior locations of the circular surface which may prevent the substrate from being positioned at a level plane, which may lead to defects on the substrate during deposition. This deposition on the circular surface may also create or exacerbate gaps between the substrate and the circular surface which can allow for process gases to flow to the underside of the substrate and cause backside deposition which, as stated above, presents disadvantages to later processing steps and ultimately may lead to defects on the substrate, or further deposition on the circular surface, which may lead to further such issues. The ESC may therefore use the upper annular ring to avoid issues related to a circular surface and in turn utilize a plurality of micro-contact area features (these MCA features are hereinafter referred to as "MCAs") arranged within a recess of the ESC body in order to support the substrate, adequately distribute the pressure of the downward clamping force, and prevent the substrate from being subject to unwanted deformation and damage.

The ESCs described herein are configured to apply a downward electrostatic clamping force onto the substrate in order to create and maintain the seal between the upper annular seal surface and the underside of the substrate. Without the application of this downward force, there may still be small gaps between the wafer edge and the annular seal surface and process gases may still flow to the underside of the substrate and cause unwanted backside deposition. For example, in some situations the force of gravity alone may not create an adequate seal that can prevent the gases from flowing underneath the substrate. In some such situations, the substrate edges may be warped or the substrate itself may be deformed, which can allow for gases to flow onto the backside of the substrate. Furthermore, some processing conditions may be more aggressive than others, such as occurring at higher temperatures and for longer durations, which may create conditions, such as causing the edges of the substrate to warp, that allow gases to flow onto the backside of the substrate and cause backside deposition. In particular, in some instances, the wafer may have material deposited on the top side of the wafer that has a different thermal expansion coefficient than the wafer itself, and during temperature changes, may cause a tensile stress gradient to develop through the thickness of the wafer, thereby causing the wafer to "dish" (exhibit slight concavity in the top surface) and causing the wafer edge to lift slightly off of the pedestal.

In many existing ESC designs, the clamping electrode(s) are embedded within a dielectric plate that is then bonded to a metal baseplate of the ESC (sometimes with other layers, such as a resistive heater layer, in between); the baseplate frequently serves both as an overall structural framework for the ESC as well as a radio-frequency (RF) electrode that is used for generating a plasma environment within the processing chamber. In many semiconductor processing operations, the ESC also may include thermal management components for heating and/or cooling the wafer. In some semiconductor processes, the wafer, while on an ESC, may be heated to temperatures ranging from approximately 30° C. to 150° C., which may be considered a low temperature range, as well as higher above 150° C., such as to 400° C., to using heating elements embedded within the ESC in order to meet certain processing requirements.

Figure 3:
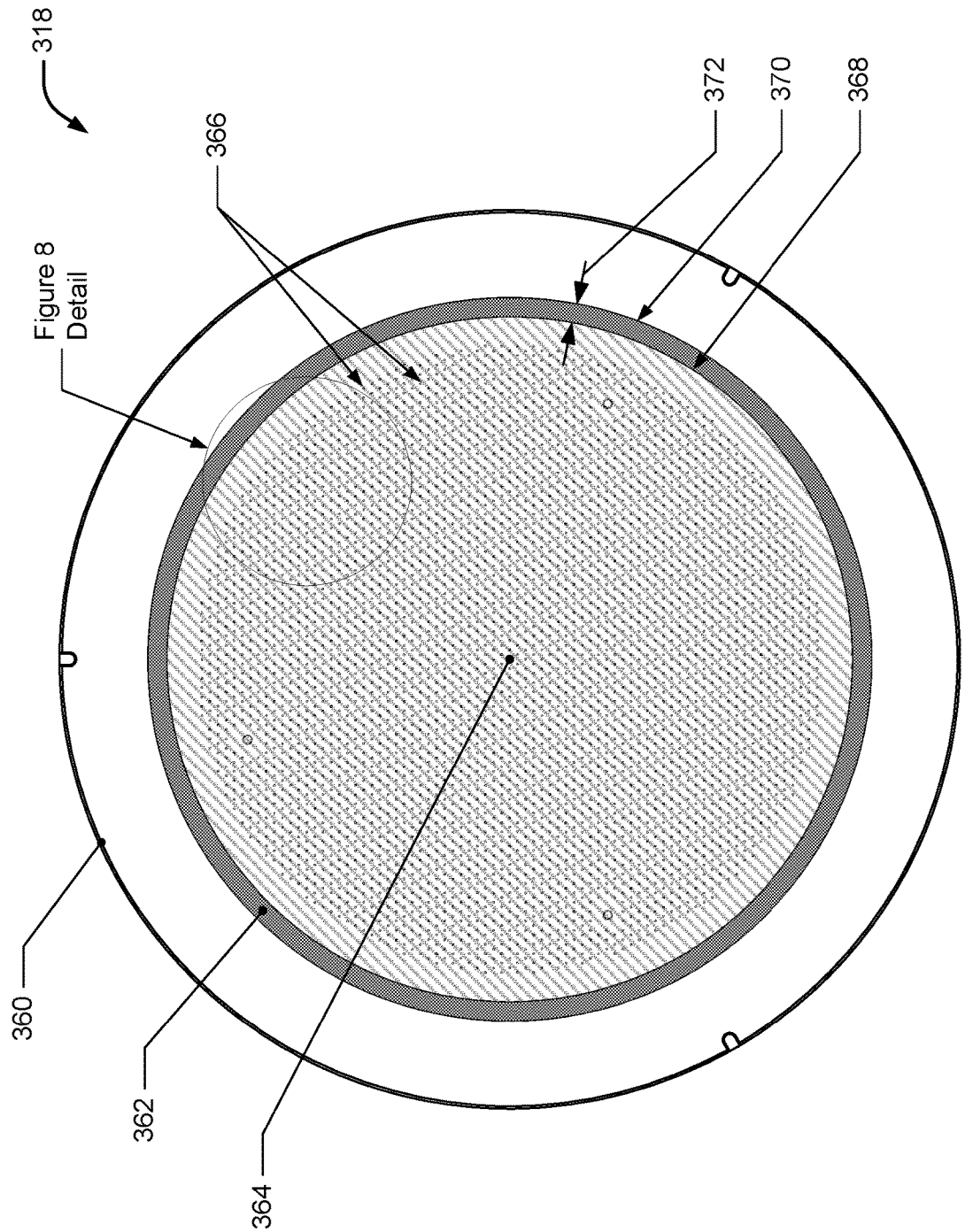
FIG. 3 depicts a top view of an example electrostatic chuck (ESC).

FIG. 3 depicts a top view of an example ESC 318 that has a body 360 which includes an upper annular seal surface 362, a recess 364 depicted in semi-transparent cross-hatching, and a plurality of micro-contact areas ("MCAs") 366 arranged within the recess 364. The view of FIG. 3 is along, i.e., parallel to, a vertical center axis of the ESC which is also perpendicular to the upper annular seal surface 362. As can be seen in FIG. 3, the upper annular seal surface 362 is a circumferential ring, depicted with shading in the Figure to highlight it, that extends completely around the recess 364. The upper annular seal surface 362 is bounded by an inner radius 368 and an outer radius 370 such that the upper annular seal surface 362 has a radial thickness 372. The upper annular seal surface 362 is configured to support the edge and a portion of the underside, or backside, of the substrate. The inner radius 368 may therefore be sized less than the radius of the substrate and the outer radius 370 may be sized greater than the radius of the substrate. For example, in some embodiments, the inner radius 368 may be between about 142.9 millimeters (about 5.625 inches) or about 131.6 millimeters (about 5.18 inches), while the outer radius may be about 150.6 millimeters (or about 5.9275 inches). In some such embodiments, the radial thickness of the upper annular seal surface may be less than or equal to about 25 millimeters, including about 15.4 millimeters (about 0.605 inches). In some embodiments, this radial thickness may be sized to support and enable the annular seal surface to seal with substrates having diameters of 300 millimeters, 450 millimeters, and 200 millimeters. The upper annular seal surface 362 is a flat, planar, and smooth surface which at least partly enables a seal to be created between the backside of the substrate and the upper annular seal surface. In some embodiments, this smoothness may be equal to or less than 0.8128 microns (32 Ra), including about 0.2032 microns (8 Ra), or lower. The flatness may have a maximum range of 0.0254 millimeters (0.001 inches), which is the maximum variance from the highest place to the lowest place of the upper annular seal surface, and a localized range of 0.00254 millimeters for each 25.4 millimeter×25.4 millimeter square of the annular seal surface (0.0001 inch for every 1 inch×1 inch square).

Figure 4A:
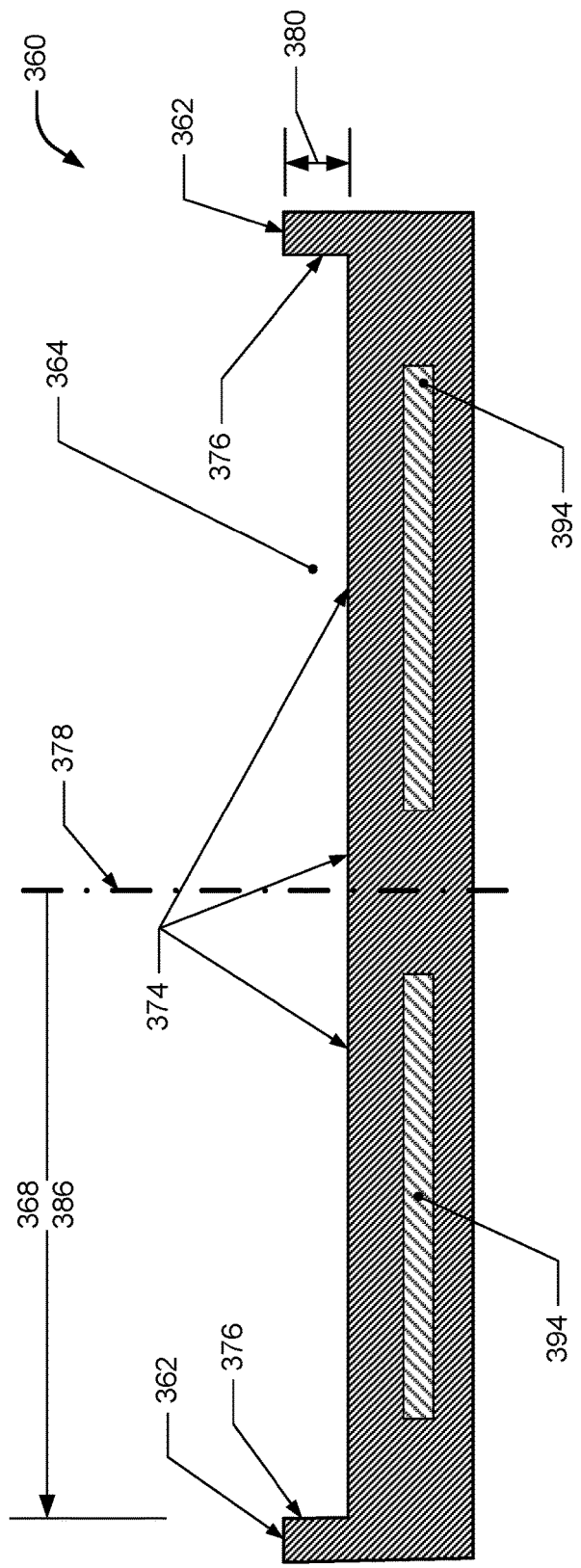
FIGS. 4A and 4B depict illustrative cross-sectional slices of the ESC body of FIG. 3; these Figures that have an exaggerated scale along the vertical axis.
Figure 4B:
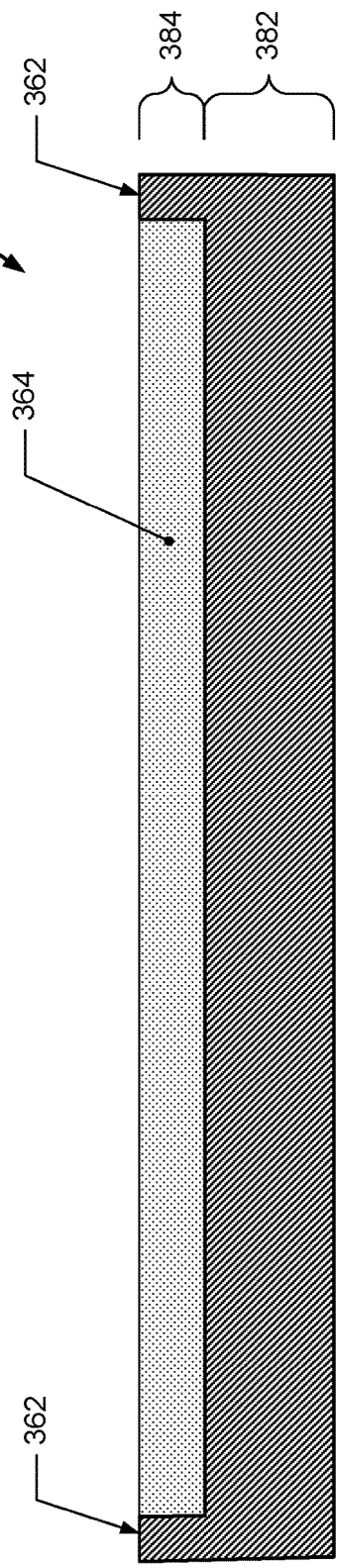

As depicted in FIG. 3, the recess 364 of the body 360 is positioned closer to the center vertical axis of the body 360 than the upper annular seal surface 362 when viewed along the center vertical axis. The upper annular seal surface 362 may be considered to extend around and at least partially bound the recess 364. The recess 364 may include a lower recess surface 374 and a recess side surface 376 from the boundary of the recess 364. FIGS. 4A and 4B depict an illustrative cross-sectional slice of the ESC body of FIG. 3. These Figures are not to scale and are exaggerated in the vertical axis in order to illustrate aspects described herein. The view of FIG. 4A is perpendicular to the vertical center axis 378 and parallel to the upper annular seal surface 362. Here, a slice of the side of the body 360 is shown that includes the lower recess surface 374, a recess side surface 376, and the upper annular seal surface 362; the MCAs are not depicted for illustrative purposes and are described below in FIGS. 6A-7.

The lower recess surface 374 may be a planar, circular surface that, as seen in FIG. 4A, is offset from, or below, the upper annular seal surface 362 along the vertical center axis 378 by a first distance 380. The lower recess surface 374 and the upper annular seal surface 362 may also be considered parallel to each other, in some embodiments. The recess side surface 376 may be a circular ring that extends around the lower recess surface 374 and may, in some embodiments, be substantially perpendicular (e.g., within +/−5% of orthogonal) to the lower recess surface 374 and/or to the upper annular seal surface 362. In some embodiments, the lower recess surface 374 may have a radius 386 that may be substantially equal to (e.g., less than about 10% or about 1%) the inner radius 368 of the upper annular seal surface 362, as shown in FIG. 4A. In FIG. 4B, the same body 360 of FIG. 4A is seen, but the volumetric representational slice of the recess 364 is shown in light shading.

In some embodiments, the body 360 may be a unitary, monolithic structure while in other embodiments it may be constructed from multiple parts. For instance, the body of FIG. 4B may include a first portion 382 that includes the lower recess surface 374 and a second portion 384 that includes the upper annular seal surface 362 and the side surface 376 and that may be an annular ring with a height that is the first distance 380 and a thickness that is the radial thickness 372. When the first and second portions 382 and 384 are connected, e.g., brazed, diffusion bonded, together in an airtight connection, the recess 364 is formed. The body may be made from a dielectric material, such as a ceramic, or may be a metal or metal alloy coated with a dielectric material.

The vertical offset 380 between the lower recess surface 374 and the upper annular seal surface may be configured to enable a clamping force to be applied to the substrate positioned on the ESC. Referring back to FIG. 4A, the body 360 includes one or more electrostatic clamp electrodes 394 that are configured to cause a downward clamping force to be applied to the substrate when the substrate is supported by the ESC and when power is supplied to the one or more electrostatic clamp electrodes 394. This clamping force between the substrate and the one or more electrostatic clamp electrodes 394 is dependent on, among other factors, the distance between the substrate and the one or more electrostatic clamp electrodes 394 such that the force decreases as the distance increases. The vertical offset 380 between the lower recess surface 374 and the upper annular seal surface 362 may therefore be sized such that the clamping force between the substrate and the ESC may be applied to keep the substrate in position on the ESC during processing operations. In some embodiments, this vertical offset 380 may be non-zero and less than or equal to 0.0381 millimeters (0.0015 inches), 0.0254 millimeters (0.001 inches), or 0.0127 millimeters (0.0005 inches). In some embodiments, the one or more electrostatic clamp electrodes may be configured to apply an electrostatic clamping force or pressure of between 1 and 40 Torr, for example (0.02 psi to 0.8 psi). In some embodiments, the body may include two or more electrostatic clamp electrodes 394 that are positioned below the lower recess surface and that are configured to connect to a DC voltage of 300 volts or greater, such as 600 volts, 700 volts, 800 volts, 900 volts, and 1,000 volts. In some embodiments, the RF electrode of the ESC also serves as the electrostatic clamp electrode such that a DC voltage is applied to the RF electrode which creates the electrostatic clamping force described herein.

The plurality of MCAs, along with the upper annular seal surface 362, are configured to support the substrate that is positioned on the ESC and to prevent undesired deformation of and pressure to the substrate when subjected to a downward electrostatic clamping force. Generally speaking, when a substrate is positioned on and supported by only an annular surface, the force of gravity on the substrate causes very little to no vertical deformation. In contrast, when that same substrate is subjected to a downward clamping force, the substrate may be caused to deform which could cause defects on and damage to the substrate. Similarly, if the substrate is supported by an annular ring and a small plurality of MCAs, such as five or 10, then the force of gravity typically does not cause undesirable pressure on the substrate. But a downward force applied to that substrate may cause undesirable deformation or point pressure where the MCAs contact the substrate, which may cause damage to or result in defects of the substrate, if there are not a sufficient number of MCAs in an adequate arrangement to equally and adequately distribute the pressure of the downward clamping force to the substrate.

Figure 5A:
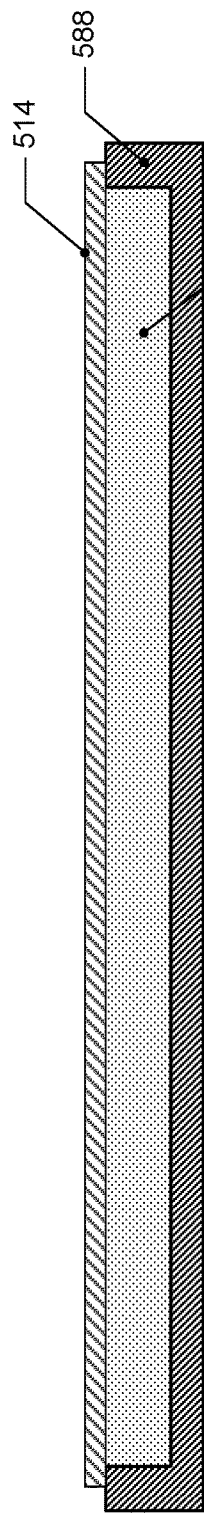
FIGS. 5A and 5B depict a cross-sectional view of an example substrate supported by an annular ring and FIG. 5C depicts a cross-section view of example substrate of FIG. 5A supported by three contact areas; these Figures that have an exaggerated scale along the vertical axis.
Figure 5B:
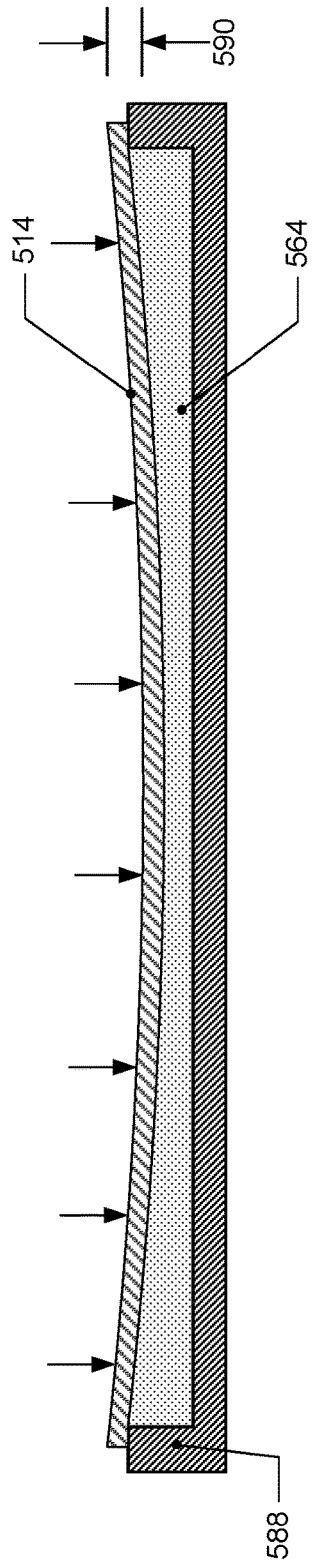
Figure 5C:
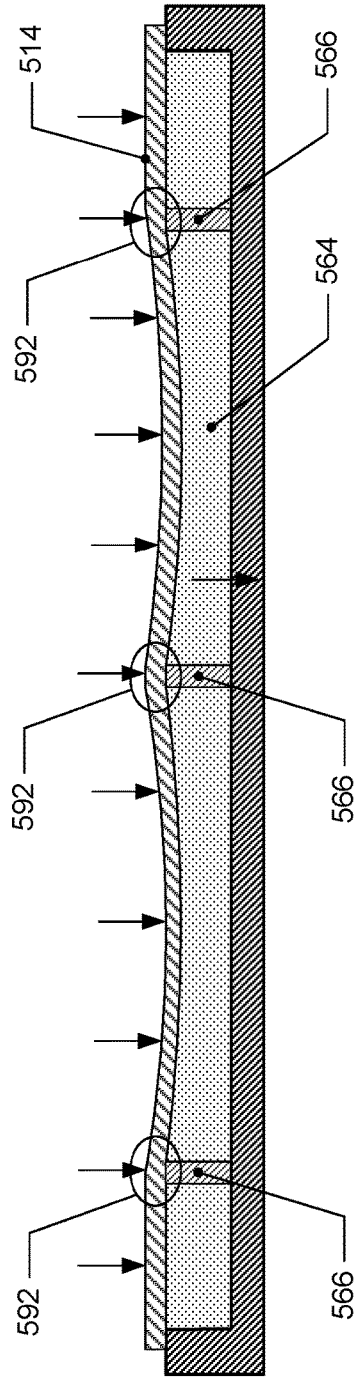

FIGS. 5A and 5B depict a cross-sectional view of an example substrate supported by an annular ring and FIG. 5C depicts a cross-section view of example substrate of FIG. 5A supported by three contact areas. Again, like with FIGS. 4A and 4B, these Figures are not to scale and are exaggerated in the vertical axis in order to illustrate aspects described herein. In FIG. 5A, the substrate 514 is supported only by an annular ring 588; a recess 564 (depicted in light shading) with no vertical supports is positioned radially within the annular ring 588 and underneath the majority of substrate 514. Here, no downward electrostatic clamping force is applied to the substrate 514, thereby not causing any deformation of the substrate 514. In FIG. 5B, a downward electrostatic clamping force is applied to the substrate 514 of FIG. 5A, as indicated by the vertically downward arrows, thereby causing the substrate 514 to deform into the recess 564 by a first deformation distance 590. As stated above, this deformation may cause damage to or defects to occur on the substrate 514. In FIG. 5C, three MCAs 566 are positioned in the recess 564 and underneath the substrate 514, but these MCAs 566 are positioned such that the pressure of the downward clamping force, illustrated with downward arrows, is not adequately distributed along the substrate, thus causing unwanted deformation to the substrate as well as point pressure where the substrate contacts the MCAs, which are circled with identifier 592.

Referring back to FIG. 3, the body, including the upper annular seal surface 362, the recess 334, and the MCAs 336 are arranged and configured to reduce or eliminate adverse effects on the substrate caused by a downward clamping force. For example, the radial thickness 372 of the upper annular seal surface and the surface area of the recess 364 (like that depicted in FIG. 3) may be arranged based on numerous factors. In some embodiments, it may be desirable to have a large recess underneath a substrate in order to provide uniform conditions to the majority of the underside of the substrate. For example, it may be advantageous to have the surface area of the recess 364 be 80%, 85%, 95%, 98%, or more, of the surface area of the underside of the substrate. It may also be advantageous to have the radial thickness 372 sized large enough, e.g., the first radius 368, small enough to allow the circumference of the edge of the substrate to circumscribe, or extend around when viewed along the vertical center axis of body, the inner circumference of the upper annular seal surface so that there is enough contact between the substrate backside and the upper annular seal surface in order to create a seal between the two surfaces. This annular thickness 372 must also be thick enough to seal around the entire edge, including an indexing or alignment notch, of the substrate while also accounting for inaccuracies and tolerances of wafer handlers that position the substrate onto the ESC.

In some embodiments, the plurality of MCAs 366 protrude from the lower recess surface 374 and have a top surface that is offset from the lower recess surface. FIG. 6A depicts the illustrative cross-sectional slice of the ESC body 360 of FIG. 4A along with MCAs. A plurality of MCAs 366 are seen protruding from the lower recess surface 374 and each MCA 366 includes a top surface 396 and a body 398. In some embodiments, the top surface 396 of each MCA may be coplanar with the upper annular seal surface 362 such that the upper annular seal surface 362 and the top surface 396 of each MCA are offset from the lower recess surface 374 by the same distance, i.e., the same vertical offset 380. In FIG. 6A, the top surfaces 396 of the MCAs are offset from the lower recess surface 374 by a second distance 3100 which may be substantially equal to the first distance 380. In some other embodiments, the top surfaces 396 of the MCAs 366 may be lower than, or less offset from the lower recess surface 374, than the upper annular seal surface 362. This may be advantageous from some substrates that may already be deformed in a concave or convex manner before being positioned on the ESC such that additional deformation is not caused by the clamping force on the substrate. This may also help with avoiding leaks, even if a substrate is planar. For instance, if there is a single "high" MCA, near the edge of the recess, it may lift up off the upper annular seal surface in that location and the clamping force may not be able to overcome that lift.

Similar to the upper annular seal surface 362, in some embodiments it is advantageous to have the top surfaces 396 of the MCAs be planar surfaces in order to provide uniform, evenly distributed contact between each MCA and the substrate. The planarity and flatness may be the same as described above for the upper annular seal surface. The body of each MCA may be interposed between the lower recess surface 374 and the top surface 396 and it may be a cylindrical body, a tapered body, or a square body, for example.

Figure 7:
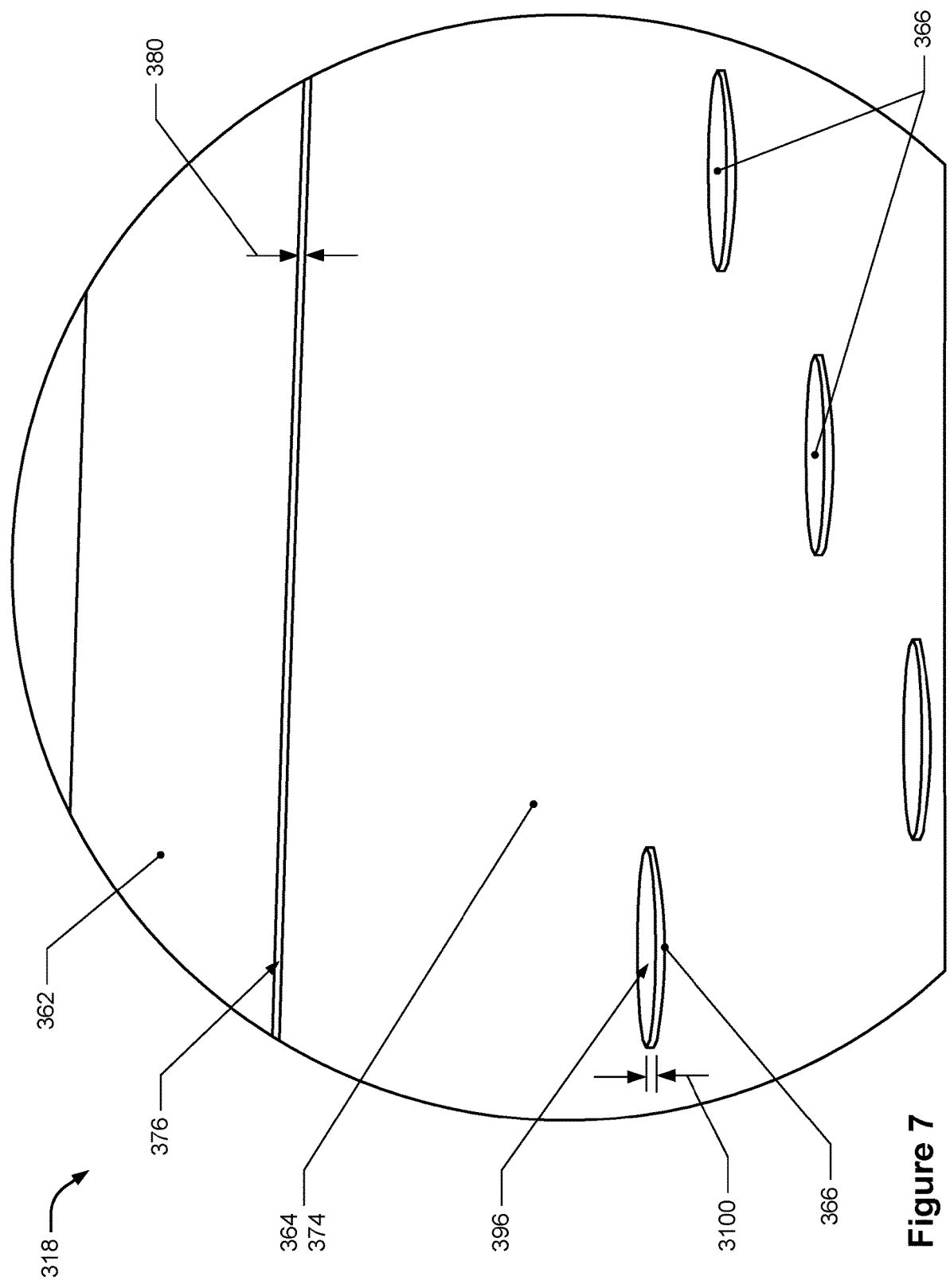
FIG. 7 depicts an off-angle detail view of a portion of the ESC in FIG. 3.

FIG. 7 depicts an off-angle detail view of a portion of the ESC in FIG. 3. This Figure is more magnified than FIG. 8 below. Here, four MCAs 366 are depicted with each MCA 366 being a cylinder having a circular, planar top surface 396 and extending up from the lower recess surface 374 by the second height 3100. A section of the upper annular seal surface 362 is also depicted and the first distance 380 and the recess side surface 376 are identified.

As stated above, the MCAs may be sized and arranged in order to uniformly distribute the pressure of the downward electrostatic clamping force to the substrate. In some embodiments, it has been found to be advantageous to use hundreds or thousands of MCAs in order to evenly distribute the pressure, such as 2,000 MCAs, 4,000 MCAs, or more. In conjunction with this, it has been found to be advantageous to have the total surface area of all the MCA top surfaces 396 be 3% or less than the overall surface area of the recess 364 that includes the surface area occupied by the MCAs; this has been found to reduce and distribute the pressure on the substrate. For example, a body may have a recess with a radius of about 142 millimeters (which may be the same as the first radius 368 of the upper annular seal surface 362) and include 4,000 MCAs that have each a top surface radius of about 0.35 millimeters, which results in the total surface area of the MCA top surfaces, 1,539.4 millimeters$^2$, being about 2.4% of the total recess surface area which is 63,347.1 millimeters$^2$.

Figure 8:
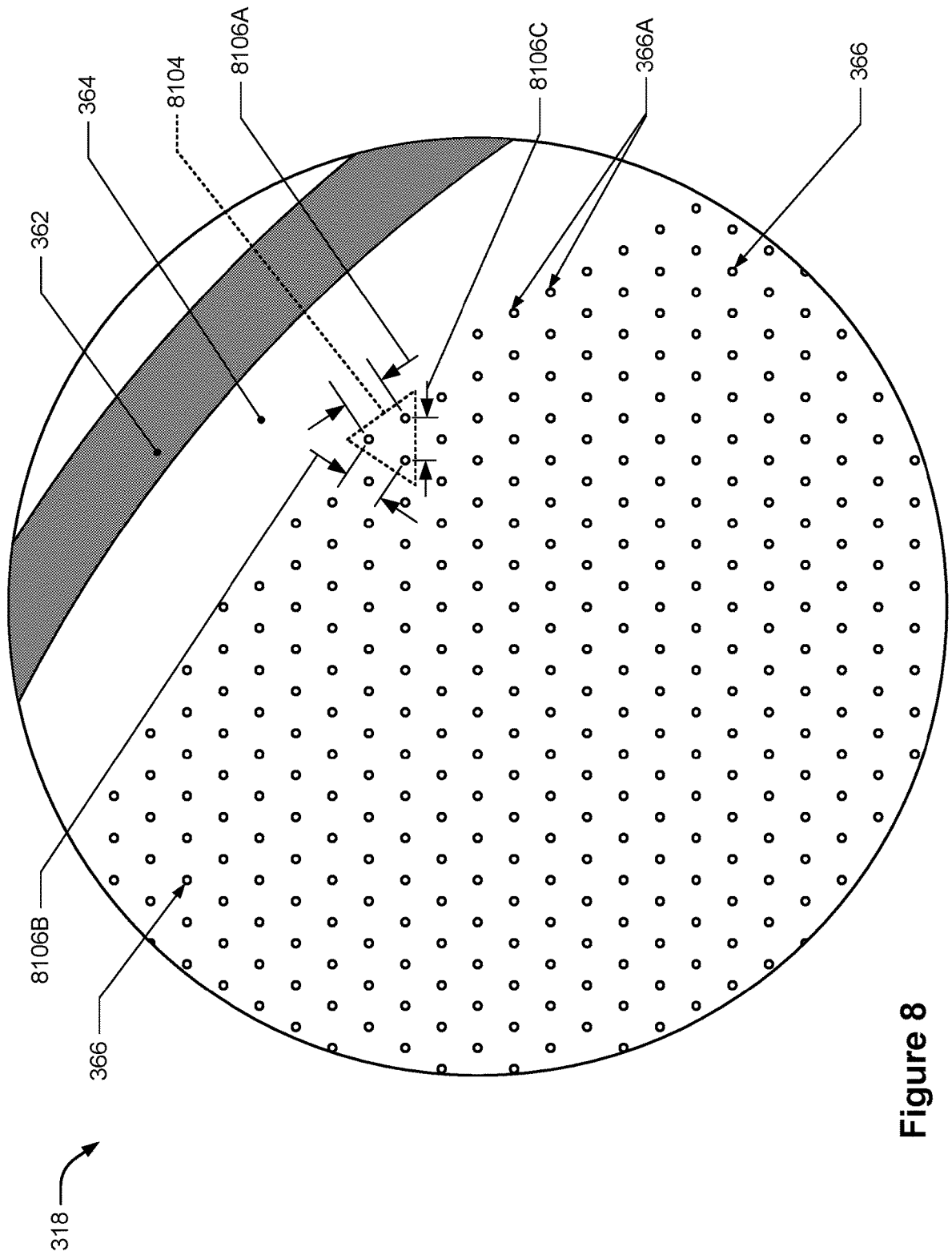
FIG. 8 depicts a detail view of the ESC body of FIG. 3 as indicated by the circular boundary on FIG. 3.

The arrangement and distribution of the MCAs within the recess may also be configured to uniformly distribute the electrostatic pressure on the substrate. For example, when viewed along the vertical axis of the body, the MCAs may be spaced uniformly, symmetrically, and equally from each other which may uniformly distribute the pressure to the wafer. FIG. 8 depicts a detail view of the ESC body of FIG. 3 as indicated by the circular boundary on FIG. 3. Here, a portion of the upper annular seal surface 362 is seen and a plurality of MCAs 366 are depicted as circular surfaces and spaced equally apart. In some embodiments, the plurality of MCAs may be arranged in a plurality of sub-arrangement patterns, such as a triangular pattern, a square pattern, a symmetrical pattern, a radial arrangement, and a hexagonal pattern. In FIG. 8, the MCAs are arranged into a plurality of symmetrical sub-arrangements that are triangles with three MCAs in each sub-arrangement triangle. One sub-arrangement 8104 is identified inside a dotted triangle and as can be seen with the three spacing measurements 8106A, B, and C, the three MCAs are spaced equally apart. In some embodiments, the equal spacing may be about 3.9 millimeters (0.1535 inches).

The arrangement and locations of the outermost MCAs may be based on several factors. These outermost MCAs are considered those MCAs closest to the upper annular seal surface, such as MCAs 366A identified in FIG. 8. Some of these factors may be the local flatness, or tolerance, of the MCA and the shape of the substrate when it is clamped, which may be governed by the Kirchoff-Love plate theory. This theory is a mathematical model used to determine the deformation and stresses of thin plates that are subjected to forces. In one example, the heights of outermost MCAs located within a recess having a radius of about 131.6 millimeters (about 5.18 inches) were found to cause a displacement at the wafer edge of about 0.00254 millimeters (0.0001 inches) which is within an acceptable flatness threshold.

As described above, when the substrate is positioned on the ESC described herein, and the electrostatic clamping force is applied to the substrate, a seal may be created between the substrate and the upper annular seal surface which reduces backside deposition on the substrate. For example, FIG. 6B depicts a substrate positioned on the representational ESC of FIG. 6A. The substrate 614 is centered over the recess 364 and supported by the MCAs 366 and the upper annular seal surface 362. When the electrostatic clamp electrodes 394 are powered and therefore cause a downward electrostatic clamping force to be applied on the substrate 614, a seal is created between the upper annular seal surface 362 and the portion of the substrate 614 contacting the upper annular seal surface 362, as identified within ellipses 6108. This seal may be considered a circumferential area that extends around the circumference of substrate 614.

The ESC and electrostatic clamping may create a seal between both planar substrates as well as some non-planar substrates which may have curved sides or a convex shape, for example, that may be caused by previous processing steps. As stated above, when these non-planar substrates are positioned on the upper annular seal surface, there may not be enough contact between the backside of the substrate and the annular seal to create a seal which may allow for unwanted backside deposition. But, when these substrates on the ESC are subjected to the downward electrostatic clamping force, the substrates may be caused to flatten thereby causing the backside of the substrate to contact and seal with the upper annular seal surface which reduces the backside deposition.

In some embodiments, the ESC described herein may be used to improve substrate centering when the substrate is being positioned onto the ESC. For example, a chucking voltage less than the voltage applied during deposition may be applied during this positioning which can prevent substrate movement as the substrate is positioned onto the ESC.

This centering of the substrate makes the backside deposition performance more robust by placing a substrate to the same spot each time such that the substrate is not resting on accumulated deposition on the ESC.

The ESC described herein may be used in a semiconductor processing system, like that described above with respect to FIGS. 1 and 2. For example, the system 200 may include the controller 238, the DC power source 226, the chamber 210 with the four process stations 231-234 that each has an ESC like described above, such as the ESC with the upper annular seal surface, recess, and MCAs arranged within the recess. The memory 244 of the controller 238 may store instructions for controlling various aspects of the system 200, including causing the substrate handler robot 236 to position a substrate on the ESC of each process station and powering the electrostatic clamp electrodes of each ESC in order to cause an electrostatic clamping force to be applied on that substrate while the substrate is on the ESC and during the positioning of the substrate onto the ESC. As stated above, the memory 244 may also include instructions for performing deposition processes, such as ALD or CVD.

In some embodiments, the structure of the electrostatic chuck described herein may be used to provide an electrode for plasma generation instead of an electrode to provide electrostatic clamping force. In these embodiments, the "clamping electrode" of the ESC may instead serve as either the powered RF electrode or the ground for plasma generation and during the processing operations, an electrostatic clamping force is not applied to the ESC and the substrate on the ESC. The substrate may therefore be positioned on the ESC, like described above, and sealed, at least in part, to the ESC under the force of gravity. Even though the electrostatic clamping force provides advantages for some substrates under some processing conditions, the ESC structure described herein still provides reductions of unwanted backside deposition without any electrostatic clamping force during processing operations as compared to conventional pedestals, such as those with a planar substrate surface. In some instances, this benefit may be provided by the radial thickness of the upper annular seal surface, described above, which prevents some backside deposition as compared to traditional pedestals.

In these embodiments in which the ESC does not apply any electrostatic clamping force and serves as an electrode for plasma generation, the ESC may be referred to as a "powered pedestal" when it serves as the powered RF electrode and referred to as a "grounded pedestal" when it serves as the ground for the plasma generation. For example, referring back to FIG. 1 and the associated description above, the ESC 118 may be a powered pedestal when it is electrically connected to the RF power supply 122 and the matching network 124 which, in some instances, may be a shared power supply between multiple stations like in FIG. 2. In these instances, the showerhead 104 or other feature in the chamber may serve as the ground. For a grounded pedestal, the ESC 118 may be electrically connected to the ground and the showerhead 104, for instance, may serve as the applied RF power source. The electrodes of the ESC described above, such as electrodes 394 shown in FIGS. 4A, 6A, and 6B and described above, may serve as either the RF ground or the applied RF power source for generating the plasma.

The structural features and configurations of these powered and grounded pedestals may be identical or nearly identical to the ESCs described above. In some such embodiments, the powered and grounded pedestals have any or all of the features of the ESCs described herein, including in any of the above-described combinations and configurations, including example ESC 318 of FIGS. 3 and 6A-8. This includes the body 360 with the upper annular seal surface 362, the recess 364, the plurality of MCAs 366 arranged within the recess 364, and any of the configurations and arrangements of these features described herein.

For instance, this includes the upper annular seal surface 362 being the circumferential ring that extends completely around the recess 364, the upper annular seal surface 362 being bounded by the inner radius 368 and the outer radius 370 such that the upper annular seal surface 362 has the radial thickness 372, and the upper annular seal surface 362 being configured to support the edge and a portion of the underside, or backside, of the substrate. This also includes any of the measurements of these features, such as the inner radius 368 being between about 142.9 millimeters (about 5.625 inches) or about 131.6 millimeters (about 5.18 inches), the outer radius being about 150.6 millimeters (or about 5.9275 inches), the radial thickness of the upper annular seal surface being less than or equal to about 25 millimeters, including about 15.4 millimeters (about 0.605 inches), the radial thickness being sized to support and enable the annular seal surface to seal with substrates having diameters of 300 millimeters, 450 millimeters, and 200 millimeters, the upper annular seal surface 362 being a flat, planar, and smooth surface as described above.

In some embodiments, this further includes the lower recess surface 374 being a planar, circular surface, as described above and seen in FIG. 4A, that is offset from, or below, the upper annular seal surface 362 along the vertical center axis 378 by the first distance 380. This also includes the configurations and arrangements of the MCAs like described above in FIGS. 6A-8. For example, the plurality of MCAs 366 may protrude from the lower recess surface 374 and have the top surface that is offset from the lower recess surface; there may also be hundreds or thousands of MCAs, such as more than 2,000 MCAs or 4,000 MCAs.

In some embodiments, the powered and grounded pedestals and the ESCs described above may differ in the electrical connections of the electrodes, the application of the electrostatic clamping force, and/or the configuration of the electrodes. In some instances, the electrodes may only be connected to an RF power supply or an electrical ground, and not a DC power source. These electrodes may be configured to receive voltage from the RF power supply. In some other instances, the electrodes may be connected to the RF power supply or electrical ground, and a DC power source, but DC power is not applied to the electrodes during processing. In some embodiments, the electrodes of the powered and grounded pedestals may not be configured to apply an electrostatic clamping force.

In some embodiments, the powered and grounded pedestals and the ESCs described above may be configured the same as the ESCs described herein such that they are configured to apply the electrostatic clamping force on a substrate as well as generate a plasma within the processing chamber. However, in these embodiments the electrostatic clamping force may not be applied during some or all of the processing operations.

Experimental Results

Figure 9:
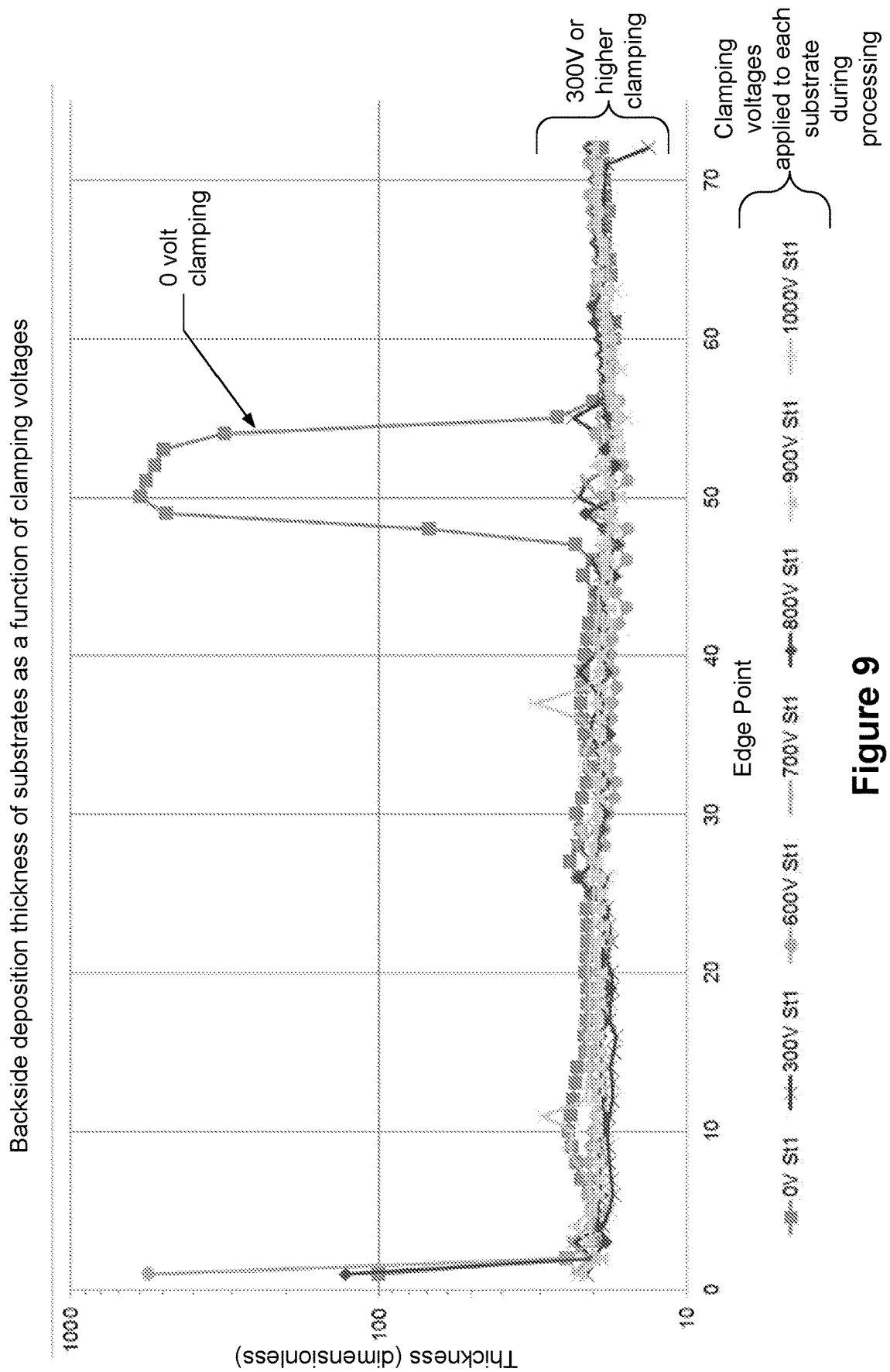
FIG. 9 depicts the results of a first deposition experiment.

The various embodiments of the ESC described herein have achieved a reduction of backside deposition on a substrate. In one experiment, the use of a clamping voltage of 300 volts or greater was shown to improve backside deposition as compared to using no clamping force. FIG. 9 depicts the results of a first deposition experiment. Here, a layer of material of material was deposited on numerous substrates at one station using various electrostatic clamping voltages. For each processed substrate, measurements at 72 points around the circumferential edge of the substrate, plus the notch, (e.g., azimuthal measurements) were taken and form the horizontal axis; the vertical axis is thickness in dimensionless units. As can be seen in FIG. 9, the substrate that had no clamping force applied, i.e., a zero voltage, had backside deposition between edge points 40 and 60 of between about 70 and about 700. In contrast, the remaining substrates each had a clamping force applied during deposition processing which ranged from about 300 V to about 1000 V, and for these substrates, the backside deposition was about 30 or less. The high measurements near point zero are the location of the notch of the substrate, which causes increased backside deposition in the area around the notch regardless of clamping.

Figure 10:
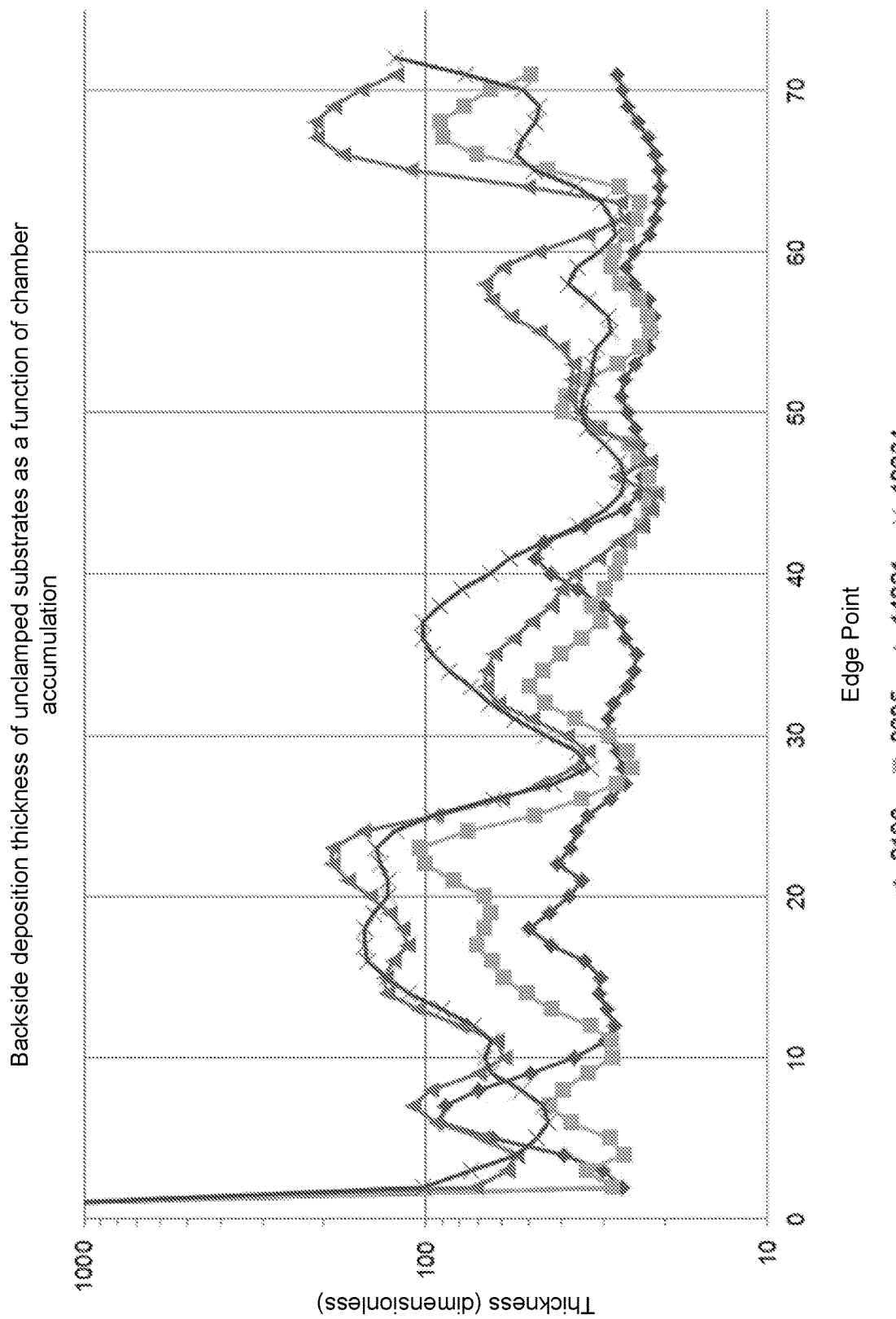
FIG. 10 depicts measurements of backside deposition thicknesses on numerous unclamped substrates on a pedestal in a process chamber as a function of chamber accumulation.

In another experiment, the backside deposition thickness for clamped and unclamped substrates was measured as a function of chamber accumulation. FIG. 10 depicts measurements of backside deposition thicknesses on numerous unclamped substrates on a pedestal in a process chamber as a function of chamber accumulation; these substrates were positioned on a traditional pedestal that does not have an upper annular seal surface, MCAs, and recess like described herein above and was not subjected to an electrostatic clamping force during deposition. Each deposition process produced a layer of material on the front side of the substrate. Similar to FIG. 9, the data shown at each chamber accumulation thickness represent backside deposition thicknesses measurements (vertical axis in dimensionless units) taken at 72 points around the circumferential edge of the substrate (the horizontal axis). As can be seen, the backside deposition thicknesses throughout the deposition process, up until a chamber accumulation of about 19,234 units, range between about 200 units and 30 units, outside the notch area. For example, at a chamber accumulation of 2,190 units, the backside deposition thicknesses range between about 30 units and 100 units, and at a camber accumulation of 14221 units, the backside deposition ranges between about 200 units and 20 units.

Figure 11:
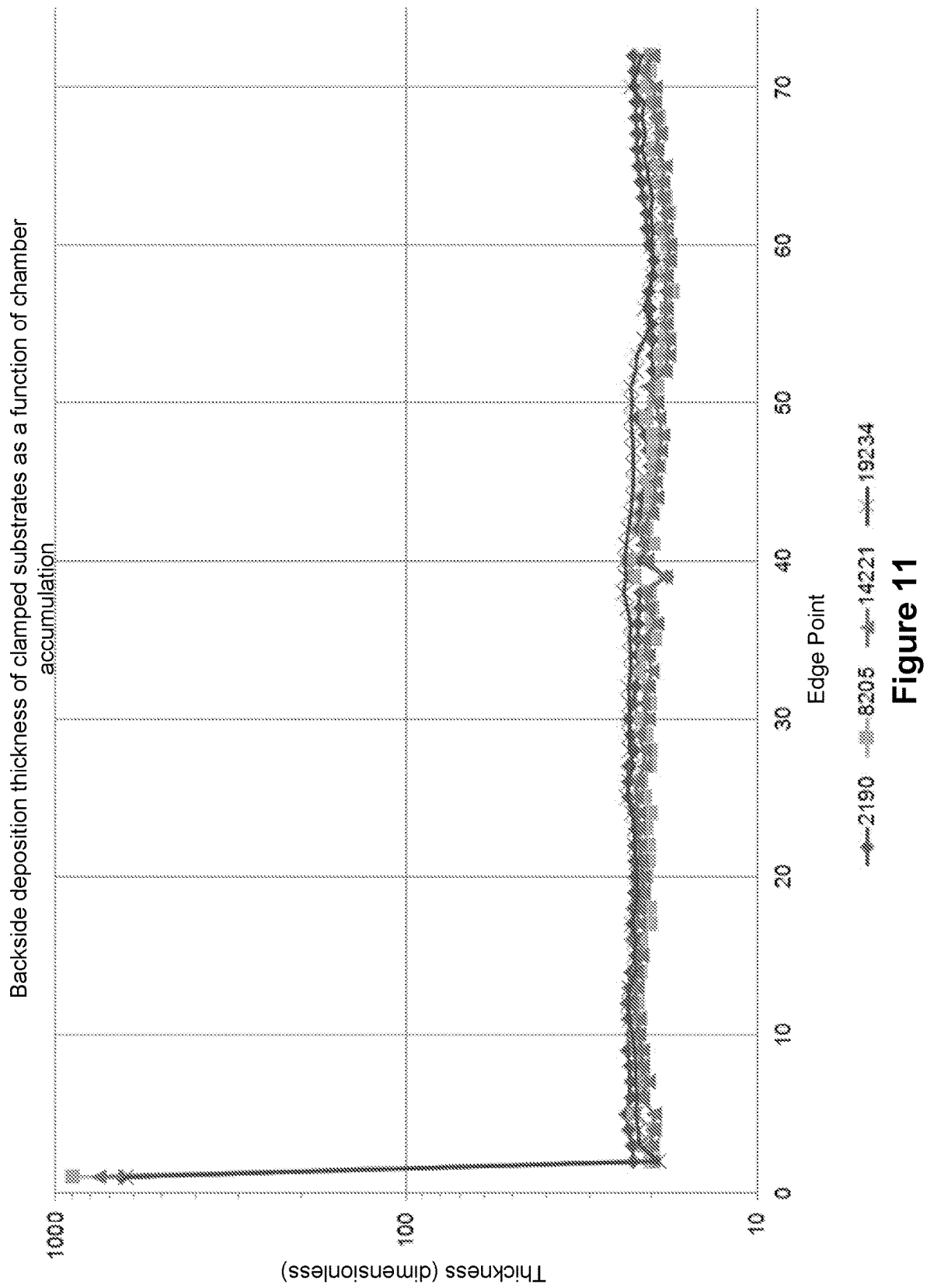
FIG. 11 depicts measurements of backside deposition thicknesses on numerous clamped substrates on an ESC in a process chamber as a function of chamber accumulation.

FIG. 11 depicts measurements of backside deposition thicknesses on numerous clamped substrates on an ESC. These substrates were positioned on an ESC that did have an upper annular seal surface, MCAs, and recess like described herein above, and during deposition the substrates were subjected to an electrostatic clamping force; the other deposition conditions were the same as in FIG. 10 and each produced a layer of material on the substrate front side. The data shown at each chamber accumulation thickness again represent backside deposition thicknesses measurements taken at approximately 72 points around the circumferential edge of the substrate. Here in FIG. 11, the backside deposition thicknesses throughout the deposition process up until a chamber accumulation of about 19,234 units, remain relatively flat and do not exceed about 30 units. In some embodiments, the backside deposition criterion is having a backside deposition less than or equal to 5% of the front side deposition at 1 millimeter from the substrate edge. Here, this substrate passes this criterion.

Figure 12:
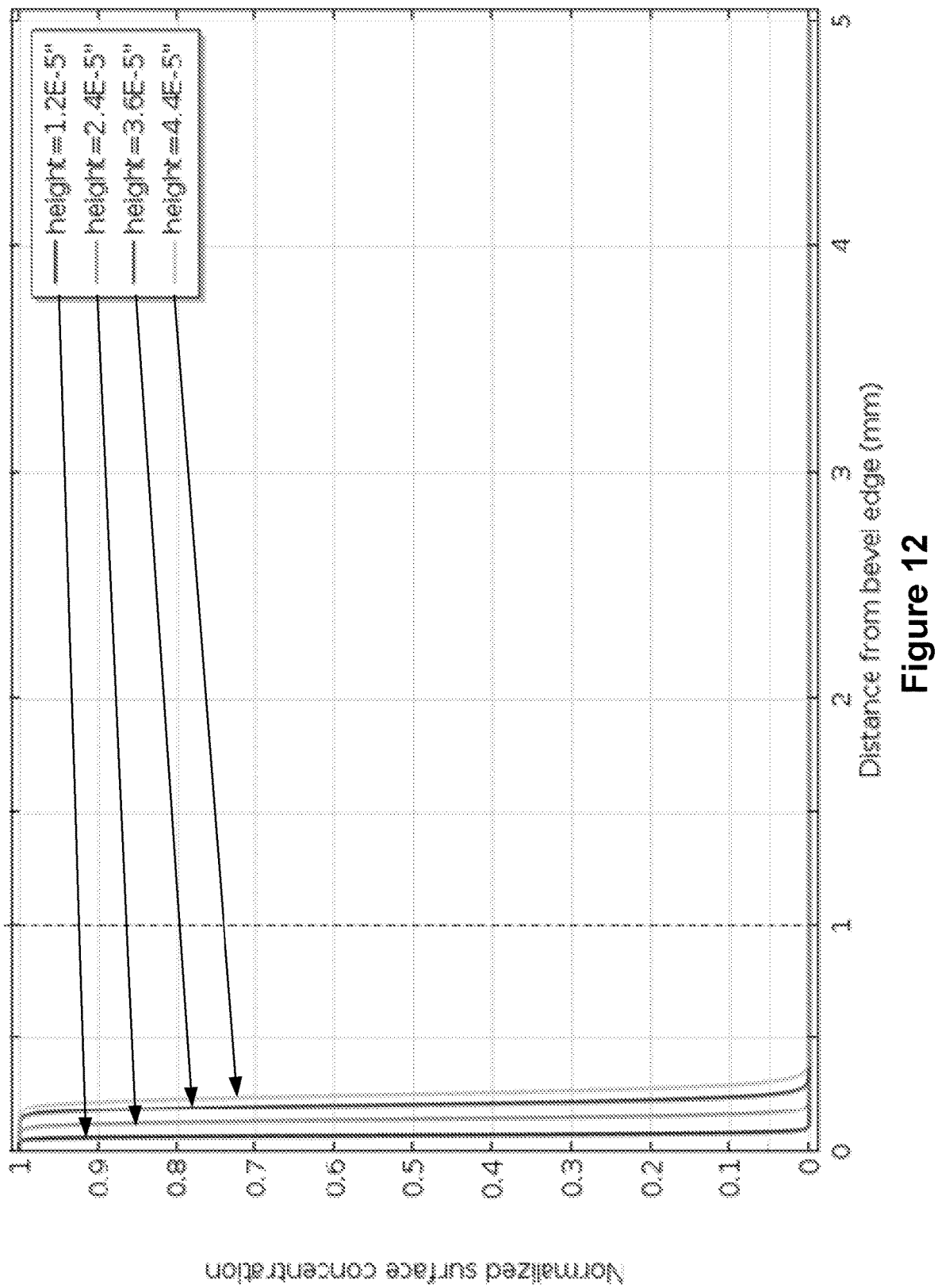
FIG. 12 depicts mathematically modeled areas of deposition on the backside of substrates.

Using mathematical modeling, it has been discovered that the ESC described herein may minimize backside deposition in a radial region of up to 1 millimeter radially inwards from the edge of the substrate to the center of the substrate. FIG. 12 depicts mathematically modeled areas of deposition on the backside of substrates. The vertical axis represents the normalized surface concentration which equals surface sites of the substrate backside that have precursor divided by the total surface site density of the substrate; the horizontal axis is the distance from the edge of the substrate (the zero point) towards the center of the substrate. Each line represents a height (in inches) of the MCAs and the upper annular seal surface, which are coplanar with each other, and measured normalized surface concentration for deposition process with 0.8 seconds of dose time. As can be seen, the presence of backside deposition did not permeate more than about 0.4 millimeters inwards from the edge of the substrate, which passes the criterion described above.

Unless the context of this disclosure clearly requires otherwise, throughout the description and the claims, the words "comprise," "comprising," and the like are to be construed in an inclusive sense as opposed to an exclusive or exhaustive sense; that is to say, in a sense of "including, but not limited to." Words using the singular or plural number also generally include the plural or singular number respectively. Additionally, the words "herein," "hereunder," "above," "below," and words of similar import refer to this application as a whole and not to any particular portions of this application. When the word "or" is used in reference to a list of two or more items, that word covers all of the following interpretations of the word: any of the items in the list, all of the items in the list, and any combination of the items in the list. The term "implementation" refers to implementations of techniques and methods described herein, as well as to physical objects that embody the structures and/or incorporate the techniques and/or methods described herein. The term "substantially" herein, unless otherwise specified, means within 5% of the referenced value. For example, substantially perpendicular means within +/−5% of parallel.

It is to be understood that the above disclosure, while focusing on particular example implementation or implementations, is not limited to only the discussed examples, but may also apply to similar variants, apparatuses, and methods as well, and such similar variants, apparatuses, and methods are also considered to be within the scope of this disclosure. In particular, the following list of numbered implementations is considered to be a part of the present disclosure.

NUMBERED LIST OF IMPLEMENTATIONS

Implementation 1: An implementation including a pedestal comprising a body that includes an upper annular seal surface that is planar, is perpendicular to a vertical center axis of the body, and has a radial thickness, a lower recess surface that is offset from the upper annular seal surface by a first distance, a plurality of micro-contact areas (MCAs) protruding from the lower recess surface, each MCA having a top surface that is offset from the lower recess surface by a second distance less than or equal to the first distance and one or more electrodes within the body, wherein the upper annular seal surface is configured to support an outer edge of a semiconductor substrate when the semiconductor substrate is being supported by the pedestal, the upper annular seal surface and the top surfaces of the MCAs are configured to support the semiconductor substrate when the semiconductor substrate is being supported by the pedestal, and the one or more electrodes are configured to electrically connect with one or more items selected from the group consisting of: a radio frequency (RF) power supply, an electrical ground, and a direct current (DC) power supply.

Implementation 2: The pedestal of implementation 1, wherein the one or more electrodes are electrostatic clamp electrodes, and the one or more electrostatic clamp electrodes are configured to provide an electrostatic clamping force on the semiconductor substrate when the semiconductor substrate is being supported by the pedestal and when the one or more electrostatic clamp electrodes are powered by the DC power supply.

Implementation 3: The pedestal of implementation 2, wherein a seal is created between the upper annular seal surface and the semiconductor substrate when the semiconductor substrate is being supported by the pedestal and when the one or more electrostatic clamp electrodes provide the electrostatic clamping force on the semiconductor substrate.

Implementation 4: The pedestal of implementation 1, wherein the one or more electrodes are configured to: electrically connect with the RF power supply, and receive RF power from the RF power supply.

Implementation 5: The pedestal of implementation 1, wherein the upper annular seal surface has an inner radius less than the radius of the semiconductor substrate, and an outer radius greater than the radius of the semiconductor substrate.

Implementation 6: The pedestal of implementation 5, wherein the inner radius is about 142 millimeters.

Implementation 7: The pedestal of implementation 6, wherein the outer radius is about 150 millimeters.

Implementation 8: The pedestal of implementation 1, wherein the radial thickness is less than or equal to about 25 millimeters.

Implementation 9: The pedestal of implementation 8, wherein the radial thickness is less than or equal to about 15 millimeters.

Implementation 10: The pedestal of implementation 1, wherein the upper annular seal surface and the top surfaces of the MCAs are coplanar, and the first distance is equal to the second distance.

Implementation 11: The pedestal of implementation 10, wherein the first distance and the second distance are equal to or between 0.0127 millimeters and 0.0381 millimeters.

Implementation 12: The pedestal of implementation 11, wherein the first distance and the second distance are 0.0254 millimeters.

Implementation 13: The pedestal of implementation 1, wherein the first distance is greater than the second distance.

Implementation 14: The pedestal of implementation 13, wherein the first distance and the second distance are equal to or between 0.0127 millimeters and 0.0381 millimeters.

Implementation 15: The pedestal of implementation 1, wherein the plurality of MCAs includes more than 2,000 MCAs.

Implementation 16: The pedestal of implementation 15, wherein the plurality of MCAs includes more than 4,000 MCAs.

Implementation 17: The pedestal of implementation 15, wherein substantially all the MCAs are spaced equally from each other.

Implementation 18: The pedestal of implementation 17, wherein substantially all MCAs are spaced from each other by 3.9 millimeters.

Implementation 19: The pedestal of implementation 15, wherein the plurality of MCAs are divided into a plurality of sub-arrangements, and the MCAS in each sub-arrangement are positioned on the lower recess surface in one or more of: a triangular pattern, a square pattern, a symmetrical pattern, a radial arrangement, and a hexagonal pattern.

Implementation 20: The pedestal of implementation 1, wherein the lower recess surface has a recess surface area, each MCA top surface has a top surface area, and a total of all the top surface areas of the MCAs in the plurality of MCAs is less than or equal to 3% of the recess surface area.

Implementation 21: The pedestal of implementation 1, wherein each MCA is a cylinder that has a planar top surface area.

Implementation 22: The pedestal of implementation 21, wherein the radius of each MCA is about 0.35 millimeters.

Implementation 23: The pedestal of implementation 1, wherein the upper annular seal surface has a roughness between about 0.8128 microns and about 0.2032 microns.

Implementation 24: The pedestal of implementation 1, wherein each MCA top surface has a roughness between about 0.8128 microns and about 0.2032 microns.

Implementation 25: The pedestal of implementation 1, wherein the upper annular seal surface has a flatness having a maximum range of 0.0254 millimeters.

Implementation 26: The pedestal of embodiment 1, wherein each MCA top surface has a flatness having a maximum range of 0.0254 millimeters.

Implementation 27: The pedestal of implementation 1, wherein the body is comprised of a ceramic.

Implementation 28: The pedestal of implementation 1, wherein the body is comprised of a metal or metal alloy, and the body is coated with a ceramic.

Implementation 29: An implementation including a semiconductor processing system comprising a processing chamber, one or more processing stations in the processing chamber, an electrostatic chuck in each of the one or more processing stations, each electrostatic chuck having a body that includes an upper annular seal surface that is planar, is perpendicular to a vertical center axis of the body, and has a radial thickness, a lower recess surface that is offset from the upper annular seal surface by a first distance, a plurality of micro-contact areas (MCAs) protruding from the lower recess surface, each MCA having a top surface that is offset from the lower recess surface by a second distance less than or equal to the first distance, and one or more electrostatic clamp electrodes within the body, wherein the upper annular seal surface is configured to support an outer edge of a semiconductor substrate when the semiconductor substrate is being supported by the electrostatic chuck, the upper annular seal surface and the top surfaces of the MCAs are configured to support the semiconductor substrate when the semiconductor substrate is being supported by the electrostatic chuck, and the one or more electrostatic clamp electrodes are configured to provide an electrostatic clamping force on the semiconductor substrate when the semiconductor substrate is being supported by the electrostatic chuck and when the one or more electrostatic clamp electrodes are powered by a DC power supply, the DC power source electrically connected to the electrostatic clamp electrodes, and a controller having a memory and a processor, the memory storing instructions configured to cause the DC power source to provide power to the electrostatic clamp electrodes in order to provide the electrostatic clamping force on the semiconductor substrate when the semiconductor substrate is being supported by the electrostatic chuck.

Implementation 30: The semiconductor processing system of implementation 29, further comprising an end effector configured to position the semiconductor substrate on each of the electrostatic chucks, wherein the memory further stores instructions configured to cause the end effector to position the semiconductor substrate on each of the electrostatic chucks, and cause, after positioning the semiconductor substrate on one of the electrostatic chucks, the DC power source to provide power to the electrostatic clamp electrodes in that one electrostatic chuck in order to provide the electrostatic clamping force on that semiconductor substrate.

Implementation 31: The semiconductor processing system of implementation 30, wherein the memory further stores instructions configured to cause, while the end effector is positioning the semiconductor substrate on one of the electrostatic chucks, the DC power source to provide power to the electrostatic clamp electrodes of that one electrostatic chuck in order to provide a lower electrostatic clamping force on that semiconductor substrate.

Implementation 32: An implementation including a semiconductor processing embodiment comprising a processing chamber, one or more processing stations in the processing chamber, a pedestal in each of the one or more processing stations, each pedestal having a body that includes an upper annular seal surface that is planar, is perpendicular to a vertical center axis of the body, and has a radial thickness, a lower recess surface that is offset from the upper annular seal surface by a first distance, a plurality of micro-contact areas (MCAs) protruding from the lower recess surface, each MCA having a top surface that is offset from the lower recess surface by a second distance less than or equal to the first distance, and one or more electrodes within the body, wherein the upper annular seal surface is configured to support an outer edge of a semiconductor substrate when the semiconductor substrate is being supported by the pedestal, the upper annular seal surface and the top surfaces of the MCAs are configured to support the semiconductor substrate when the semiconductor substrate is being supported by the pedestal, and the one or more electrodes are configured to electrically connect with a radio frequency (RF) power supply, a showerhead above the pedestal electrically connected to an electrical ground, the RF power supply electrically connected to the one or more electrodes, and a controller having a memory and a processor, the memory storing instructions configured to cause the RF power source to provide an RF voltage to the one or more electrodes in order to generate a plasma between the pedestal and the showerhead.

Implementation 33: The semiconductor processing system of implementation 32, wherein an electrostatic clamping force is not applied to the substrate while the plasma is generated between the pedestal and the showerhead.

Implementation 34: The semiconductor processing system of implementation 32, further comprising a direct current (DC) power source, wherein the DC power source is electrically connected to the one or more electrodes, the one or more electrodes are configured to provide an electrostatic clamping force on the semiconductor substrate when the semiconductor substrate is being supported by the pedestal and when the one or more electrodes are powered by the DC power source, and the memory further stores instructions configured to cause the DC power source to provide power to the one or more electrodes in order to provide the electrostatic clamping force on the semiconductor substrate when the semiconductor substrate is being supported by the pedestal.

What is claimed is:

1. A semiconductor processing system comprising:
    a processing chamber;
    at least one processing station in the processing chamber;
    an electrostatic chuck in the at least one processing station, the electrostatic chuck having a body that includes:
        an upper annular seal surface that is planar, is perpendicular to a vertical center axis of the body, and has a radial thickness,
        a lower recess surface that is offset from the upper annular seal surface by a first distance,
        a plurality of micro-contact areas (MCAs) protruding from the lower recess surface, each MCA having a top surface that is offset from the lower recess surface by a second distance less than or equal to the first distance, and
        one or more electrodes within the body, wherein:
        the upper annular seal surface is configured to support an outer edge of a semiconductor substrate when the semiconductor substrate is being supported by the electrostatic chuck,
        the upper annular seal surface and the top surfaces of the MCAs are configured to support the semiconductor substrate when the semiconductor substrate is being supported by the electrostatic chuck, and
        the one or more electrodes are configured to provide, when powered by a power supply, at least one electrostatic clamping force on the semiconductor substrate as part of supporting the semiconductor substrate on the electrostatic chuck;
    the power supply electrically connected to the one or more electrodes, wherein the power supply comprises a direct current (DC) power supply and a radio frequency (RF) power supply;
    an end effector configured to position the semiconductor substrate on the electrostatic chuck; and
    a controller having a memory and one or more processors, the memory storing computer-executable instructions, which, when executed by the one or more processors, cause the one or more processors to:
        cause, at least in part, the end effector to position the semiconductor substrate on the electrostatic chuck;
        cause, while positioning the semiconductor substrate on the electrostatic chuck, the power supply to provide DC power to the one or more electrodes to provide the electrostatic clamping force on the semiconductor substrate;
        cause, after positioning the semiconductor substrate on the electrostatic chuck, the power supply to stop providing DC power and thereby stop providing the electrostatic clamping force on the semiconductor substrate; and
        cause, after positioning the semiconductor substrate on the electrostatic chuck and stopping providing DC power to the one or more electrodes, the power supply to provide RF power, and not DC power, to the one or more electrodes to generate a plasma in the at least one processing station during at least one processing operation, wherein the electrostatic clamping force is not applied to the semiconductor substrate while generating the plasma during the at least one processing operation.

2. The semiconductor processing system of claim 1, wherein a seal is created between the upper annular seal surface and the semiconductor substrate as part of the semiconductor substrate being supported by the electrostatic chuck.

3. The semiconductor processing system of claim 1, wherein the upper annular seal surface has an inner radius that is less than the radius of the semiconductor substrate, and an outer radius that is greater than the radius of the semiconductor substrate.

4. The semiconductor processing system of claim 3, wherein the inner radius is about 142 millimeters.

5. The semiconductor processing system of claim 4, wherein the outer radius is about 150 millimeters.

6. The semiconductor processing system of claim 1, wherein the radial thickness is less than or equal to about 25 millimeters.

7. The semiconductor processing system of claim 6, wherein the radial thickness is less than or equal to about 15 millimeters.

8. The semiconductor processing system of claim 1, wherein:
the upper annular seal surface and the top surfaces of the MCAs are coplanar, and
the first distance is equal to the second distance.

9. The semiconductor processing system of claim 8, wherein the first distance and the second distance are equal to or between 0.0127 millimeters and 0.0381 millimeters.

10. The semiconductor processing system of claim 9, wherein the first distance and the second distance are 0.0254 millimeters.

11. The semiconductor processing system of claim 1, wherein the first distance is greater than the second distance.

12. The semiconductor processing system of claim 11, wherein the first distance and the second distance are equal to or between 0.0127 millimeters and 0.0381 millimeters.

13. The semiconductor processing system of claim 1, wherein the plurality of MCAs includes more than 2,000 MCAs.

14. The semiconductor processing system of claim 13, wherein the plurality of MCAs includes more than 4,000 MCAs.

15. The semiconductor processing system of claim 13, wherein substantially all the MCAs are spaced equally from each other.

16. The semiconductor processing system of claim 15, wherein substantially all the MCAs are spaced from each other by 3.9 millimeters.

17. The semiconductor processing system of claim 13, wherein:
the MCAs are divided into a plurality of sub-arrangements, and
the MCAs in each sub-arrangement are positioned on the lower recess surface in one or more of: a triangular pattern, a square pattern, a symmetrical pattern, a radial arrangement, and a hexagonal pattern.

18. The semiconductor processing system of claim 1, wherein:
the lower recess surface has a recess surface area,
each MCA has a top surface having a top surface area, and
a total of all the top surface areas of the MCAs in the plurality of MCAs is less than or equal to 3% of a sum of the recess surface area and the total of all the top surface areas.

19. The semiconductor processing system of claim 1, wherein each MCA is a cylinder that has a planar top surface area.

20. The semiconductor processing system of claim 19, wherein the radius of each MCA is about 0.35 millimeters.

21. The semiconductor processing system of claim 1, wherein the upper annular seal surface has a surface roughness between about 0.8128 microns and about 0.2032 microns.

22. The semiconductor processing system of claim 1, wherein each MCA has a top surface having a roughness between about 0.8128 microns and about 0.2032 microns.

23. The semiconductor processing system of claim 1, wherein the upper annular seal surface has a flatness having a maximum range of 0.0254 millimeters.

24. The semiconductor processing system of claim 1, wherein each MCA has a top surface having a flatness having a maximum range of 0.0254 millimeters.

25. The semiconductor processing system of claim 1, wherein the body comprises a ceramic.

26. The semiconductor processing system of claim 1, wherein:
the body is formed of a metal or metal alloy, and
the body is coated with a ceramic.

27. The semiconductor processing system of claim 1, wherein:
the at least one processing station is one of a plurality of processing stations in the processing chamber; and
each of the plurality of processing stations includes a corresponding instance of the electrostatic chuck.

28. The semiconductor processing system of claim 27, wherein the semiconductor processing system is configured to:
distribute DC power from the DC power supply to each of the electrostatic chucks; and
distribute RF power from the RF power supply to each of the electrostatic chucks.

29. The semiconductor processing system of claim 1, further comprising:
a showerhead in the at least one processing station, the showerhead overlapping the electrostatic chuck in a direction parallel to the vertical center axis of the body,
wherein the plasma is caused, at least in part, to be generated between the electrostatic chuck and the showerhead.

30. The semiconductor processing system of claim 29, wherein:
the at least one processing station is one of a plurality of processing stations in the processing chamber; and
each of the plurality of processing stations includes a corresponding instance of the electrostatic chuck and a corresponding instance of the showerhead overlapping with the corresponding instance of the electrostatic chuck in the direction parallel to the vertical center axis of that electrostatic chuck.

31. The semiconductor processing system of claim 1, wherein the power supply is configured to apply voltage in a range of 300 V to 1000 V to the at least one of the one or more electrodes to induce the electrostatic clamping force.

32. The semiconductor processing system of claim 1, wherein the second distances of the MCAs are sized to correspond with a non-zero curvature of the semiconductor substrate.

33. The semiconductor processing system of claim 32, wherein the second distances of the MCAs are sized such that the non-zero curvature of the semiconductor substrate is maintained while at least the electrostatic clamping force is applied to the semiconductor substrate.

* * * * *